(12) United States Patent
Lee et al.

(10) Patent No.: US 11,075,250 B2
(45) Date of Patent: Jul. 27, 2021

(54) LIGHT-EMITTING DEVICE PACKAGE, DISPLAY DEVICE INCLUDING THE SAME, AND METHOD OF MANUFACTURING THE SAME

(71) Applicant: SAMSUNG ELECTRONICS CO., LTD., Suwon-si (KR)

(72) Inventors: Dong-gun Lee, Hwaseong-si (KR); Joo-sung Kim, Seongnam-si (KR); Jong-uk Seo, Hwaseong-si (KR); Young-jo Tak, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/383,839

(22) Filed: Apr. 15, 2019

(65) Prior Publication Data
US 2019/0393279 A1    Dec. 26, 2019

(30) Foreign Application Priority Data

Jun. 26, 2018 (KR) .......................... 10-2018-0073459

(51) Int. Cl.

| | | |
|---|---|---|
| *H01L 27/32* | (2006.01) | |
| *G06K 9/00* | (2006.01) | |
| *H01L 25/18* | (2006.01) | |
| *H01L 27/12* | (2006.01) | |
| *H01L 33/50* | (2010.01) | |
| *H01L 33/60* | (2010.01) | |
| *H01L 31/12* | (2006.01) | |
| *H01L 51/56* | (2006.01) | |
| *H01L 31/18* | (2006.01) | |
| *H01L 31/0232* | (2014.01) | |

(52) U.S. Cl.
CPC ........ *H01L 27/3227* (2013.01); *G06K 9/0004* (2013.01); *H01L 31/02327* (2013.01); *H01L 31/12* (2013.01); *H01L 31/18* (2013.01); *H01L 51/56* (2013.01)

(58) Field of Classification Search
CPC ........ G02B 27/30; G06K 9/0004; G06F 21/32
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |

(Continued)

FOREIGN PATENT DOCUMENTS

KR    10-2018-0001206 A    1/2018

*Primary Examiner* — Brian Turner
(74) *Attorney, Agent, or Firm* — Sughrue Mion, PLLC

(57) ABSTRACT

A light-emitting device package is provided. The light-emitting device package includes: a substrate having a first surface and a second surface, and having a first opening and a second opening spaced apart from each other; a light-emitting structure disposed on the first surface of the substrate and vertically overlapping the first opening; and an image sensor including a photoelectric conversion region, the photoelectric conversion region being disposed in the substrate and vertically overlapping the second opening. Light from the light-emitting structure is emitted toward the second surface of the substrate through the first opening.

16 Claims, 39 Drawing Sheets

(56) References Cited

U.S. PATENT DOCUMENTS

| | | |
|---|---|---|
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 8/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,825,016 B1 | 11/2017 | Kim et al. |
| 9,859,330 B2 | 1/2018 | Von Maim et al. |
| 9,934,418 B2 | 4/2018 | Mienko et al. |
| 2010/0007632 A1* | 1/2010 | Yamazaki ............ G06F 3/0421 345/175 |
| 2012/0086044 A1 | 4/2012 | Hata et al. |
| 2012/0146953 A1* | 6/2012 | Yl ......................... G06F 3/0412 345/175 |
| 2012/0268701 A1* | 10/2012 | Nemoto .................. G06F 3/042 349/106 |
| 2016/0035921 A1* | 2/2016 | Matsuda ........... H01L 27/14645 348/374 |
| 2016/0372514 A1 | 12/2016 | Chang et al. |
| 2017/0161540 A1 | 6/2017 | Mienko et al. |
| 2017/0250316 A1* | 8/2017 | Yeon ....................... H01L 33/50 |
| 2018/0012069 A1 | 1/2018 | Chung et al. |
| 2018/0307088 A1* | 10/2018 | Liu .................... G02F 1/133345 |
| 2019/0050621 A1* | 2/2019 | Xu ......................... G02B 27/30 |
| 2019/0056613 A1* | 2/2019 | Wang ................. G02F 1/13338 |
| 2019/0067385 A1* | 2/2019 | Xu ...................... H01L 27/3244 |
| 2019/0272408 A1* | 9/2019 | Ding .................... G06K 9/0008 |
| 2019/0340409 A1* | 11/2019 | Zhu ....................... H01L 27/326 |

* cited by examiner

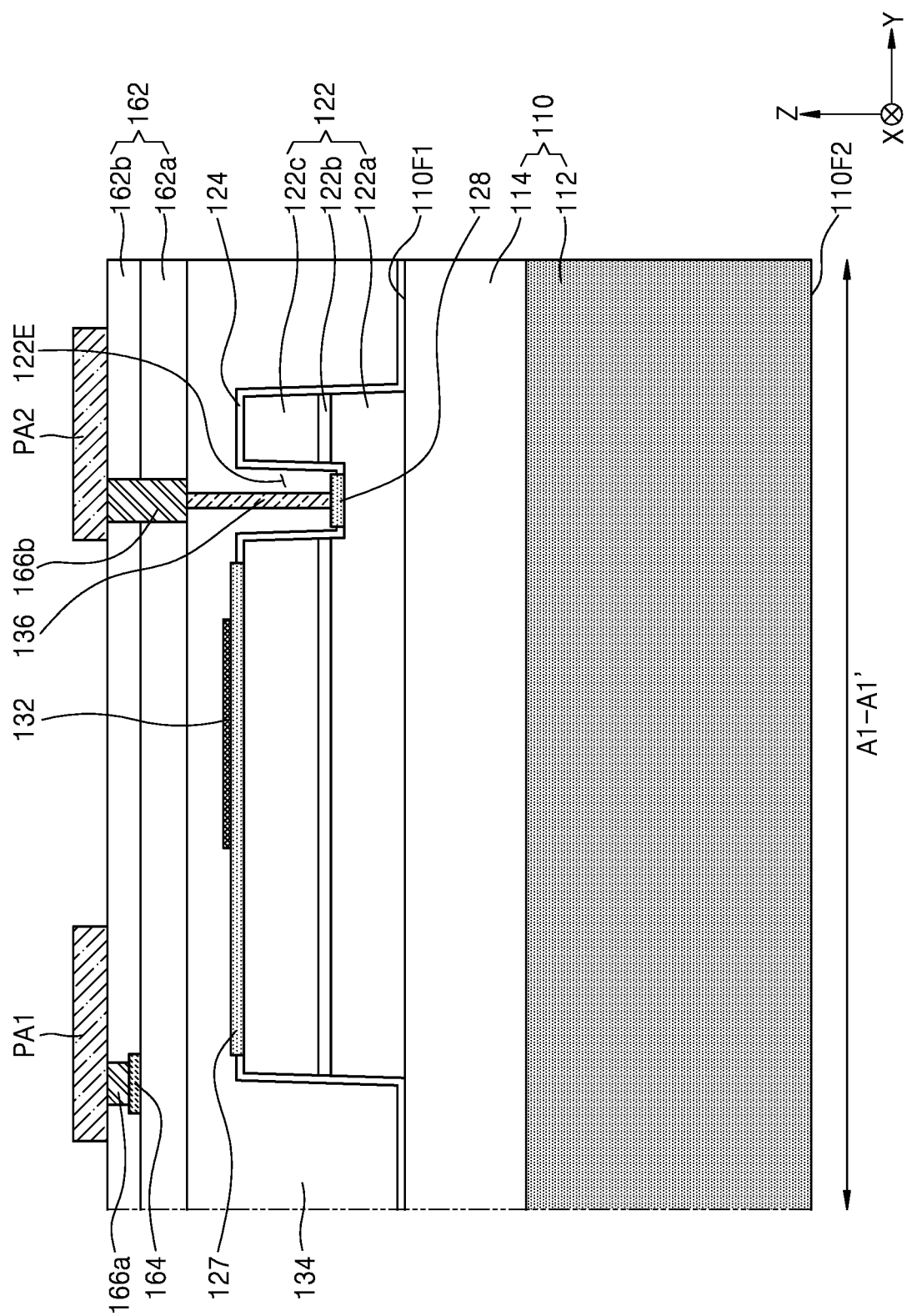

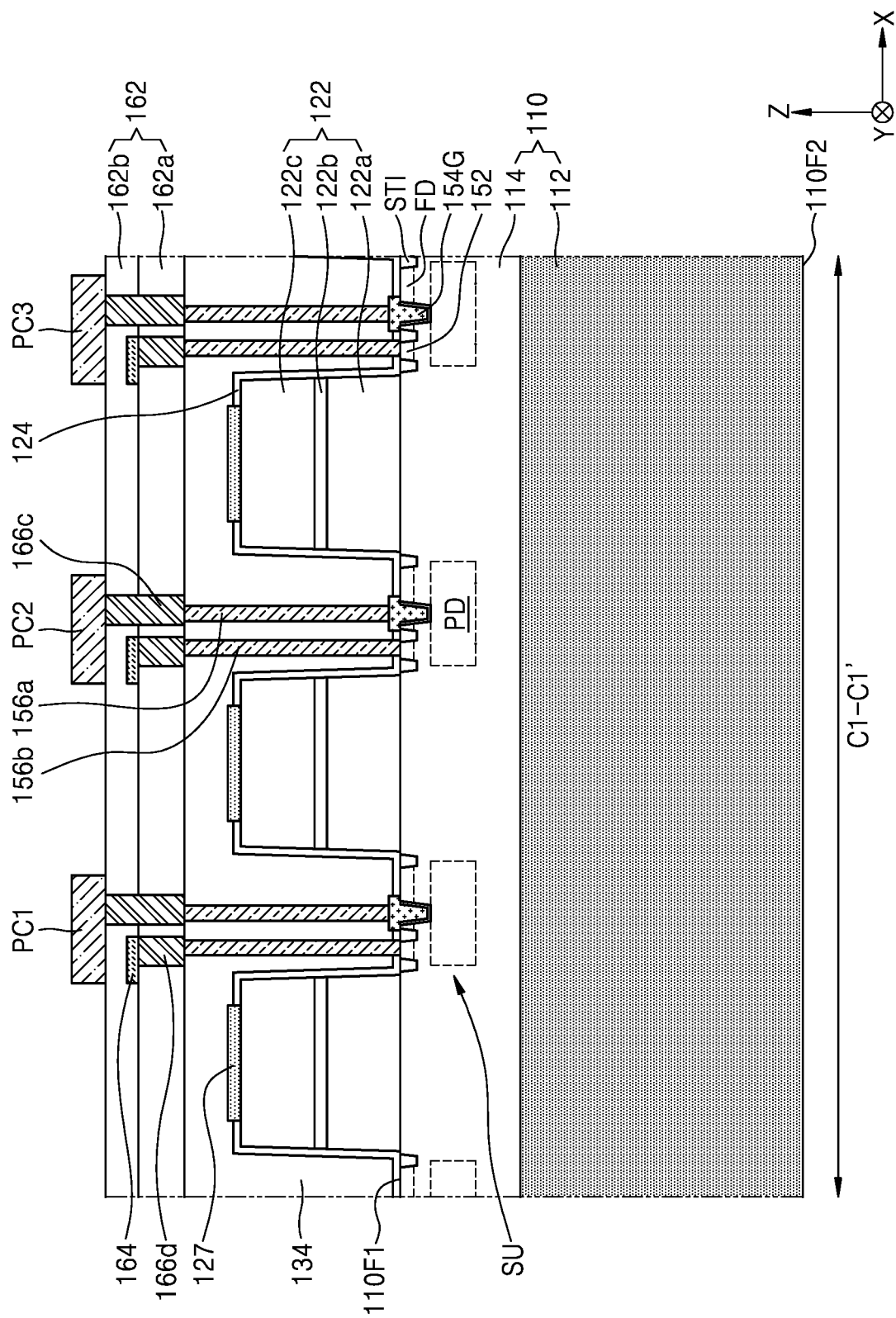

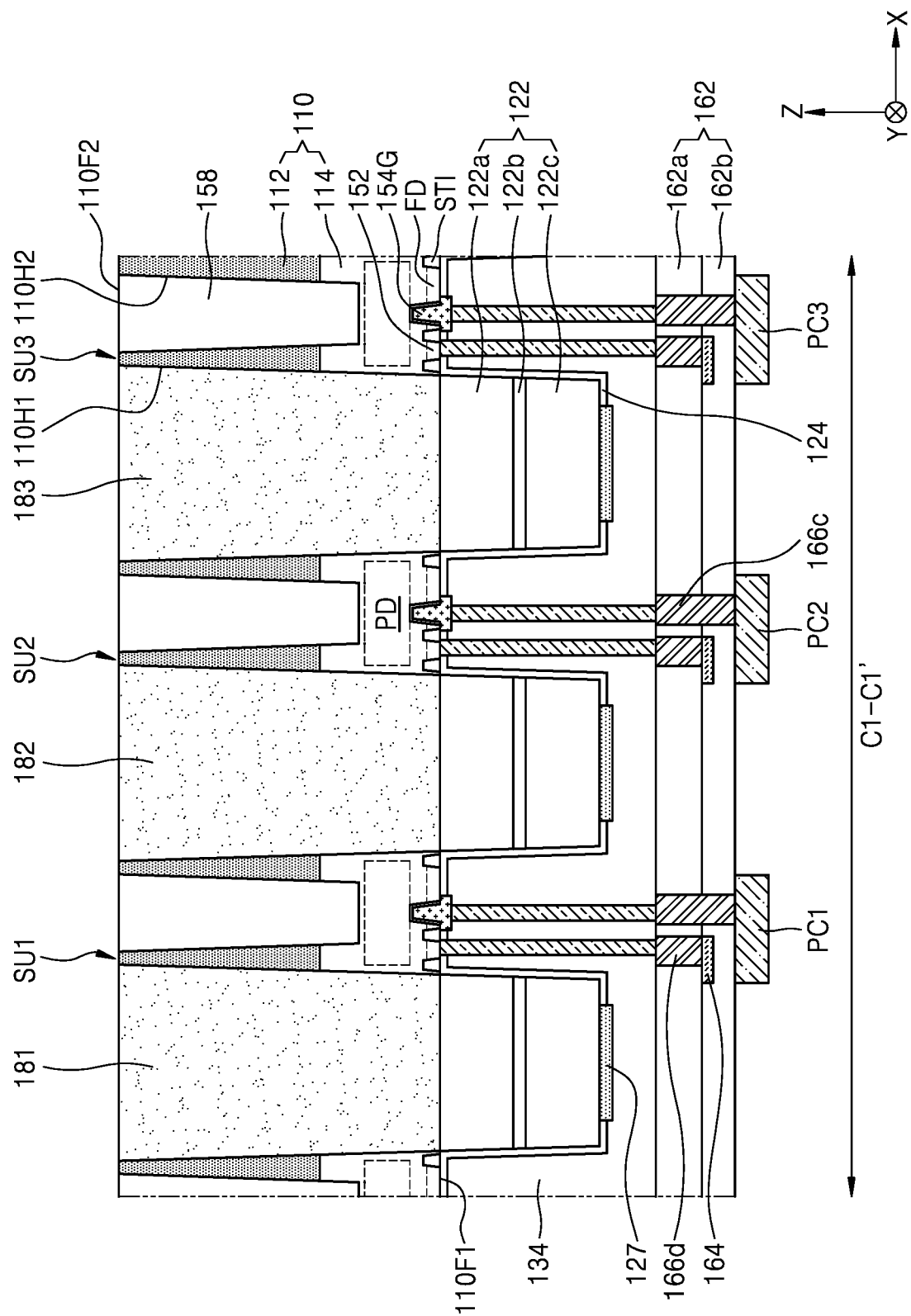

LIGHT-EMITTING DEVICE PACKAGE, DISPLAY DEVICE INCLUDING THE SAME, AND METHOD OF MANUFACTURING THE SAME

CROSS-REFERENCE TO THE RELATED APPLICATION

This application claims priority from Korean Patent Application No. 10-2018-0073459, filed on Jun. 26, 2018, in the Korean Intellectual Property Office, the disclosure of which is incorporated herein in its entirety by reference.

BACKGROUND

Apparatuses and methods consistent with the example embodiments of the inventive concept relate to a light-emitting device package based on a compound semiconductor, a display device including the light-emitting device package, and a method of manufacturing the light-emitting device package.

Semiconductor light-emitting devices are widely used as light sources for display devices as well as light sources for lighting devices. Recently, a display device has been proposed in which a light-emitting device is used as one pixel. In addition, mobile devices such as a smart phone or a wearable device equipped with a fingerprint sensor are widely used, but in such devices the thickness of the display device is increased as a separate substrate with a fingerprint sensor is attached to the display panel.

SUMMARY

Example embodiments of the inventive concept provide a light-emitting device package in which an on-display fingerprint sensor and a support substrate of a light-emitting device are integrally provided and a substrate with a separate fingerprint sensor mounted thereon is not required, and a display device employing the light-emitting device package.

According to an example embodiment, there is provided a light-emitting device package which may include: a substrate having a first surface and a second surface and having a first opening and a second opening spaced apart from each other; a light-emitting structure disposed on the first surface of the substrate and vertically overlapping the first opening; and an sensor including a photoelectric conversion region, the photoelectric conversion region being disposed in the substrate and vertically overlapping the second opening, wherein light from the light-emitting structure is emitted toward the second surface of the substrate through the first opening.

According to an example embodiment, there is provided a display device which may include a display area and a fingerprint-sensing area overlapping at least a portion of the display area, wherein the fingerprint-sensing area includes the above light-emitting device package.

According to an example embodiment, there is provided a display device including a plurality of pixels, wherein at least one of the plurality of pixels includes the above light-emitting device package.

According to an example embodiment, there is provided a method of manufacturing a light-emitting device package which may include: forming a plurality of light-emitting structures on a first surface in a first region of a substrate; forming a photoelectric conversion region in a second region of the substrate; removing the first region of the substrate from a second surface opposite the first surface of the substrate to form a plurality of first openings exposing the plurality of light-emitting structures; and removing the second region of the substrate from the second surface of the substrate to form a plurality of second openings exposing the photoelectric conversion region.

According to an example embodiment, there is provided a display device including a plurality of pixels each of which includes a plurality of subpixels, wherein the plurality of subpixels include and share a light-emitting structure configured to generate and emit light, wherein the light-emitting structure is formed on a first surface of a substrate and includes as many number of regions as the plurality of subpixels, and wherein at least one image sensor is provided on a second surface, opposite to the first surface, of the substrate where the light emitting structure is divided to form the regions of the light emitting structure, and is configured to sense light reflected by an object on the substrate, based on light emitted from the light-emitting structure.

BRIEF DESCRIPTION OF THE DRAWINGS

Example embodiments of the inventive concept will be more clearly understood from the following detailed description taken in conjunction with the accompanying drawings, in which.

DETAILED DESCRIPTION OF THE EXAMPLE EMBODIMENTS

Figure 1:
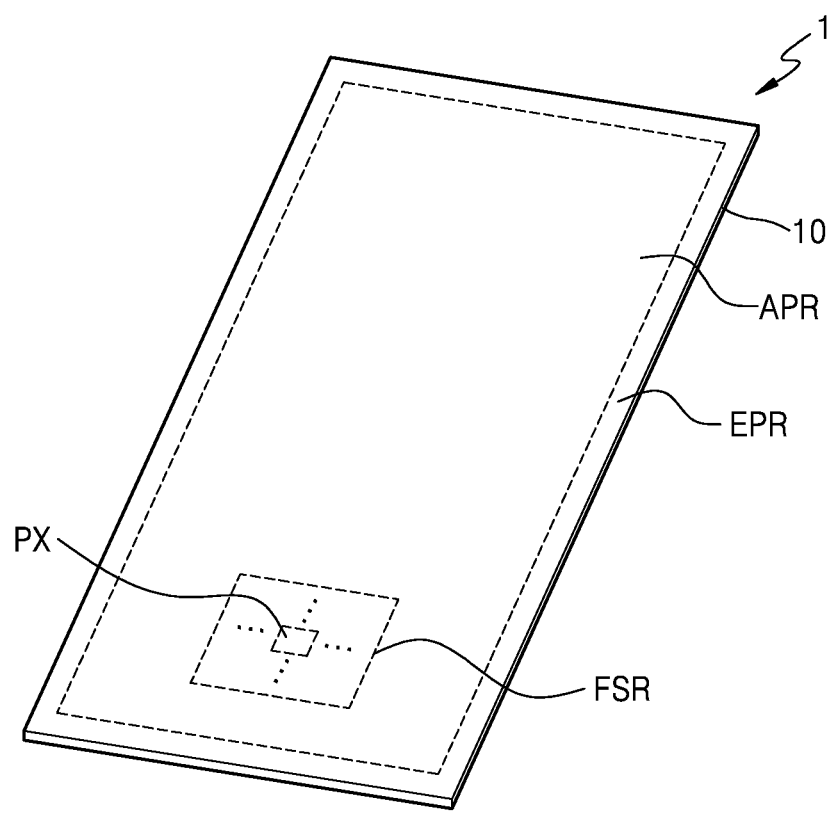
FIG. 1 is a perspective view of a representative configuration of a display device according to an example embodiment.

Hereinafter, example embodiments of the inventive concept will be described in detail with reference to the accompanying drawings. The inventive concept may, however, be embodied in many different forms and should not be construed as limited to the example embodiments set forth herein Like reference numerals refer to like elements throughout the specification and drawings.

An example embodiment provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present Like numerals refer to like elements throughout. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
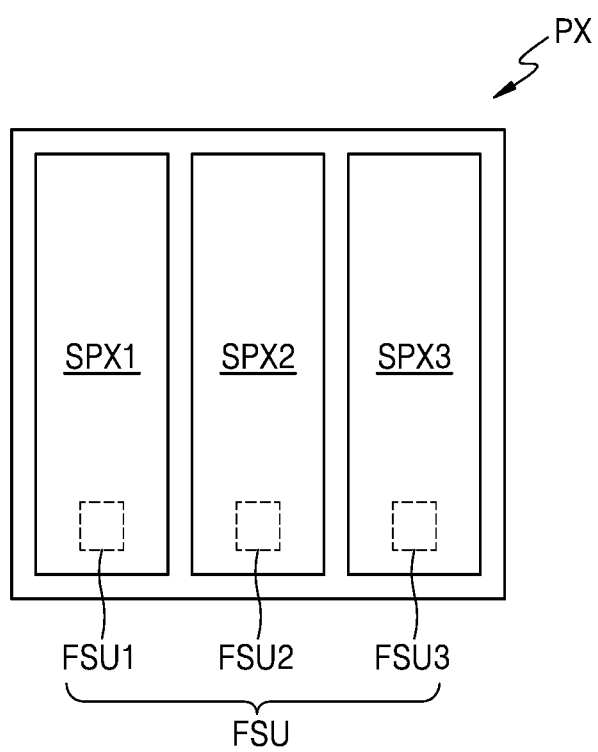
FIG. 2 is a plan view of one pixel shown in FIG. 1, according to an example embodiment.

FIG. 1 is a perspective view of a representative configuration of a display device 1 according to example embodiments. FIG. 2 is a plan view of one pixel PX shown in FIG. 1.

Referring to FIGS. 1 and 2, the display device 1 may include a display panel 10, and the display panel 10 may include a display area APR and a peripheral area EPR surrounding the display area APR in a plan view. The display area APR may include a plurality of pixels PX capable of displaying an image in response to a signal. The display panel 10 may include a printed circuit board (not shown) and a light-emitting device package (not shown) mounted on the printed circuit board. The light-emitting device package may include a plurality of light-emitting devices respectively corresponding to the plurality of pixels PX.

The display panel 10 may include a fingerprint-sensing area FSR that overlaps at least a portion of the display area APR. The fingerprint-sensing area FSR may recognize an object contacting the display panel 10, for example, a finger of a user, by using an optical method and convert fingerprint information into an image signal. For example, when light emitted from the fingerprint-sensing area FSR is reflected by ridges of a fingerprint and valleys between the ridges, a reflected light may be sensed through an image sensor in the fingerprint-sensing area FSR, thereby recognizing the fingerprint. A plurality of pixels PX in the fingerprint-sensing area FSR may emit light for fingerprint sensing and also sense light reflected by the fingerprint.

FIG. 1 shows an example in which the fingerprint-sensing area FSR is formed in a part of a lower portion of the display panel 10, but the position and area of the fingerprint-sensing area FSR is not limited thereto. In other embodiments, the fingerprint-sensing area FSR may be positioned throughout the entire area of the display panel 10 to have the same area as the display area APR.

As shown in FIG. 2, the fingerprint-sensing area FSR may include a plurality of pixels PX each including an image sensor FSU. Each of the plurality of pixels PX may include a first subpixel SPX1, a second subpixel SPX2, and a third subpixel SPX3 which are successively arranged in one direction. The first subpixel SPX1, the second subpixel SPX2, and the third subpixel SPX3 may include a first sensor FSU1, a second sensor FSU2, and a third sensor FSU3, respectively.

The first to third subpixels SPX1, SPX2, and SPX3 may emit light of different wavelengths in response to an input signal. For example, the first to third subpixels SPX1, SPX2, and SPX3 may emit red (R) light, green (G) light, and blue (B) light, respectively. In example embodiments, the first to third subpixels SPX1, SPX2, and SPX3 may include a compound semiconductor light-emitting device that emits light with different wavelengths from a compound semiconductor material layer. For example, the compound semiconductor material layer may include a Group III-V semiconductor material.

The first to third sensors FSU1, FSU2 and FSU3 may be formed in a substrate for supporting the compound semiconductor light-emitting device in the first to third subpixels SPX1, SPX2 and SPX3, and accordingly, the compound semiconductor light-emitting device and an sensor FSU, i.e., the first to third sensors FSU1, FSU2 and FSU3, may be provided integrally. For example, light emitted by the first to third subpixels SPX1, SPX2 and SPX3 in the pixel PX may be reflected by ridges and valleys of the fingerprint, and the image sensor FSU may sense the reflected light to generate an image signal for the fingerprint.

Figure 3:
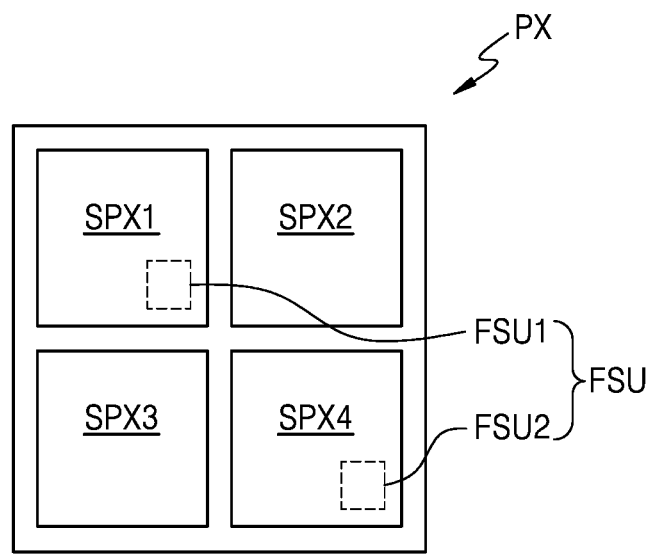
FIG. 3 is a plan view of one pixel according to an example embodiment.

FIG. 3 is a plan view of one pixel PX according to an example embodiment.

Referring to FIG. 3, the pixel PX may include a first subpixel SPX1, a second subpixel SPX2, a third subpixel SPX3, and a fourth subpixel SPX4 which are arranged in a matrix form. For example, the first to fourth subpixels SPX1, SPX2, SPX3, and SPX4 may be arranged in a matrix of 2×2.

At least one of the first to fourth subpixels SPX1, SPX2, SPX3, and SPX4 may include an image sensor FSU. FIG. 3 shows an example in which the first subpixel SPX1 includes a first sensor FSU1, the fourth subpixel SPX4 arranged diagonally from the first subpixel SPX1 includes a second sensor FSU2, and the second and third subpixels SPX2 and SPX3 do not include a sensor. However, the inventive concept is not limited thereto.

Figure 4:
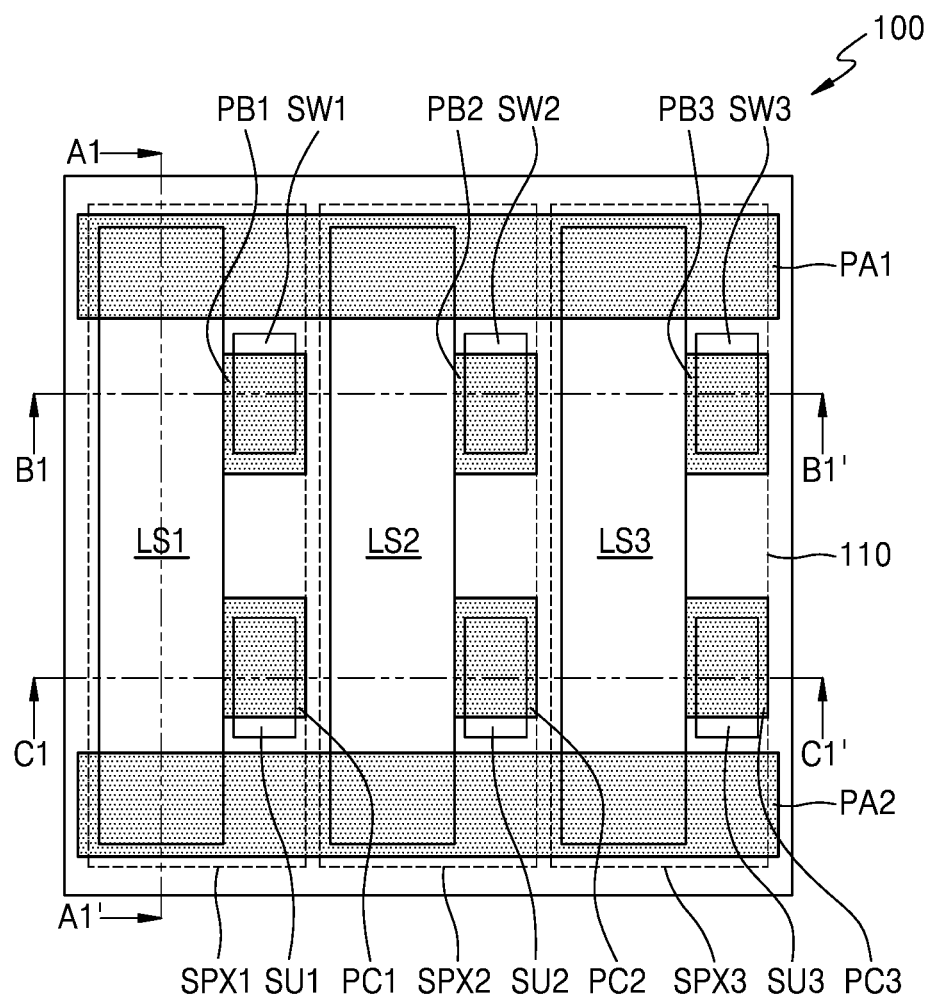
FIG. 4 is a plan view of a main configuration of a light-emitting device package according to an example embodiment.
Figure 5:
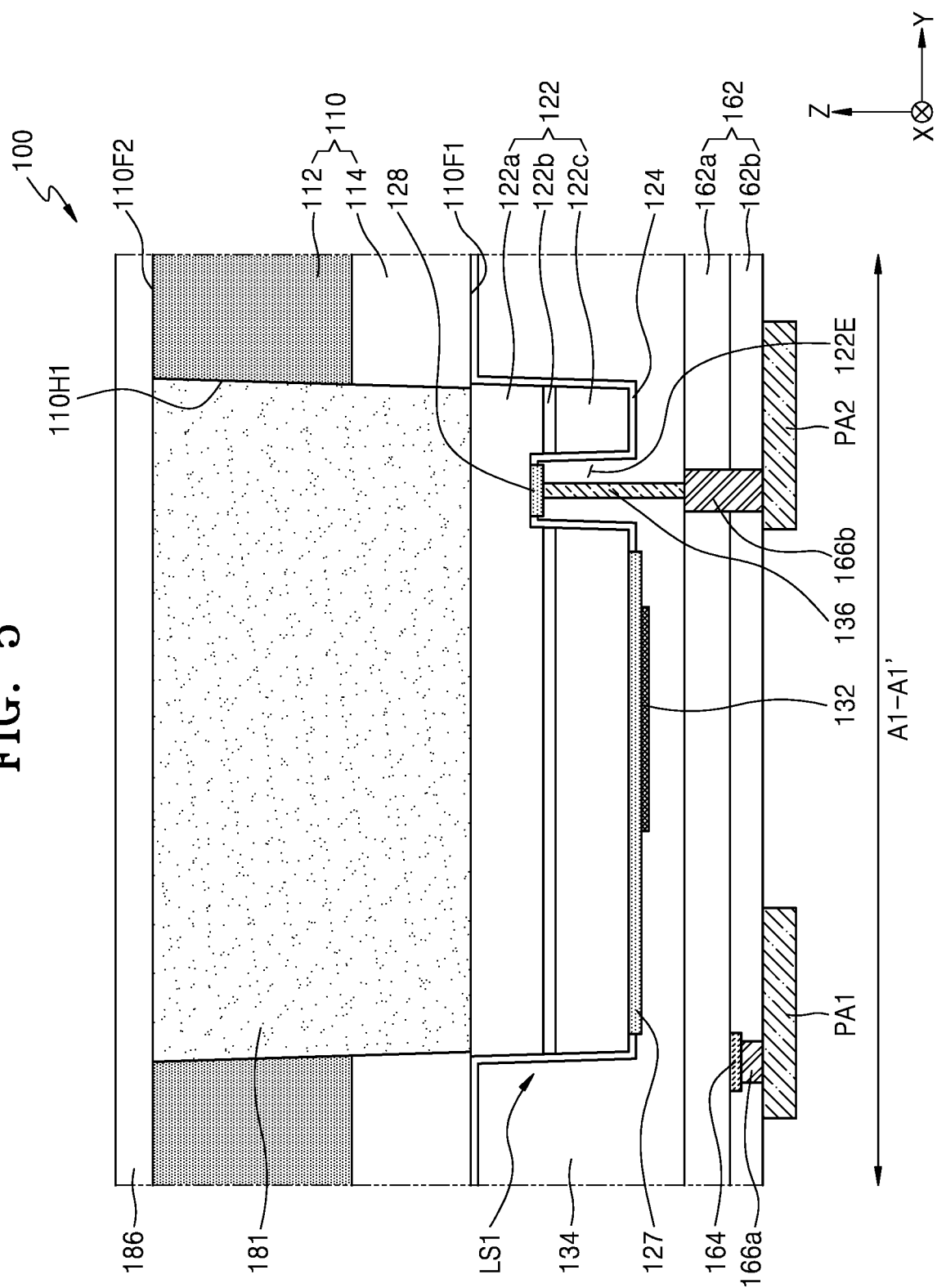
FIG. 5 is a cross-sectional view taken along line A1-A1' of FIG. 4, according to an example embodiment.
Figure 6:
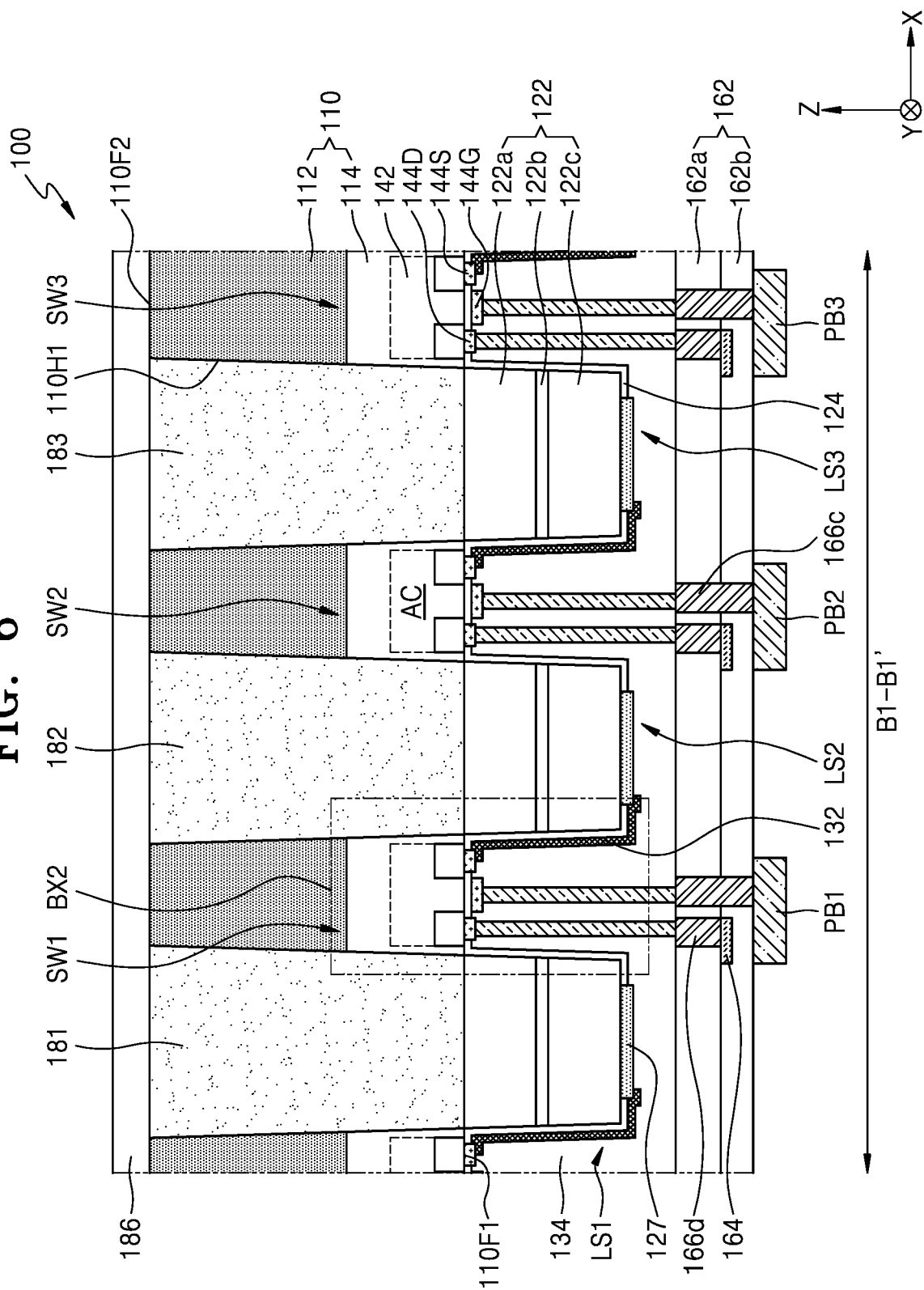
FIG. 6 is a cross-sectional view taken along line B1-B1' of FIG. 4, according to an example embodiment.
Figure 7:
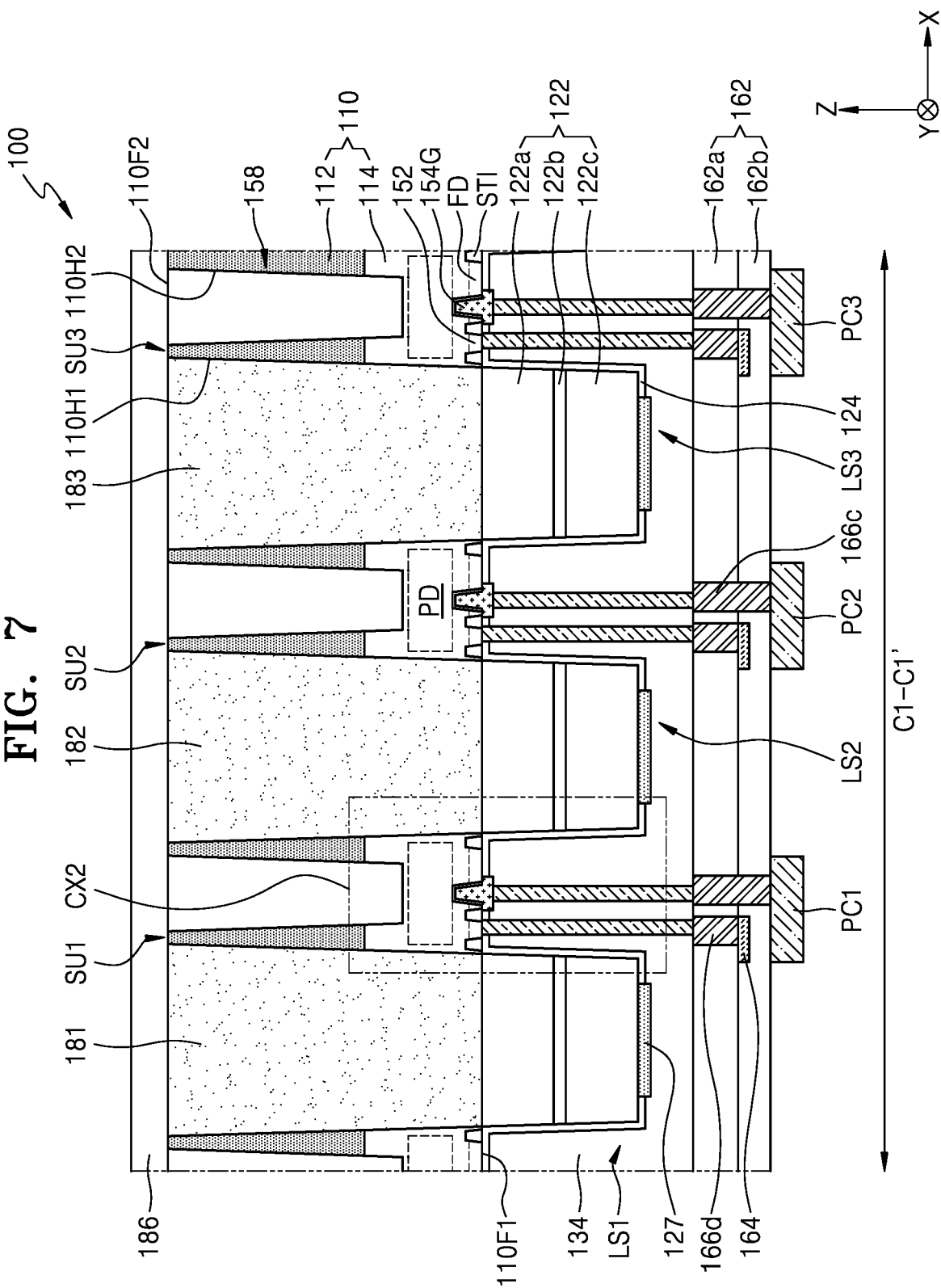
FIG. 7 is a cross-sectional view taken along line C1-C1' of FIG. 4, according to an example embodiment.
Figure 8:
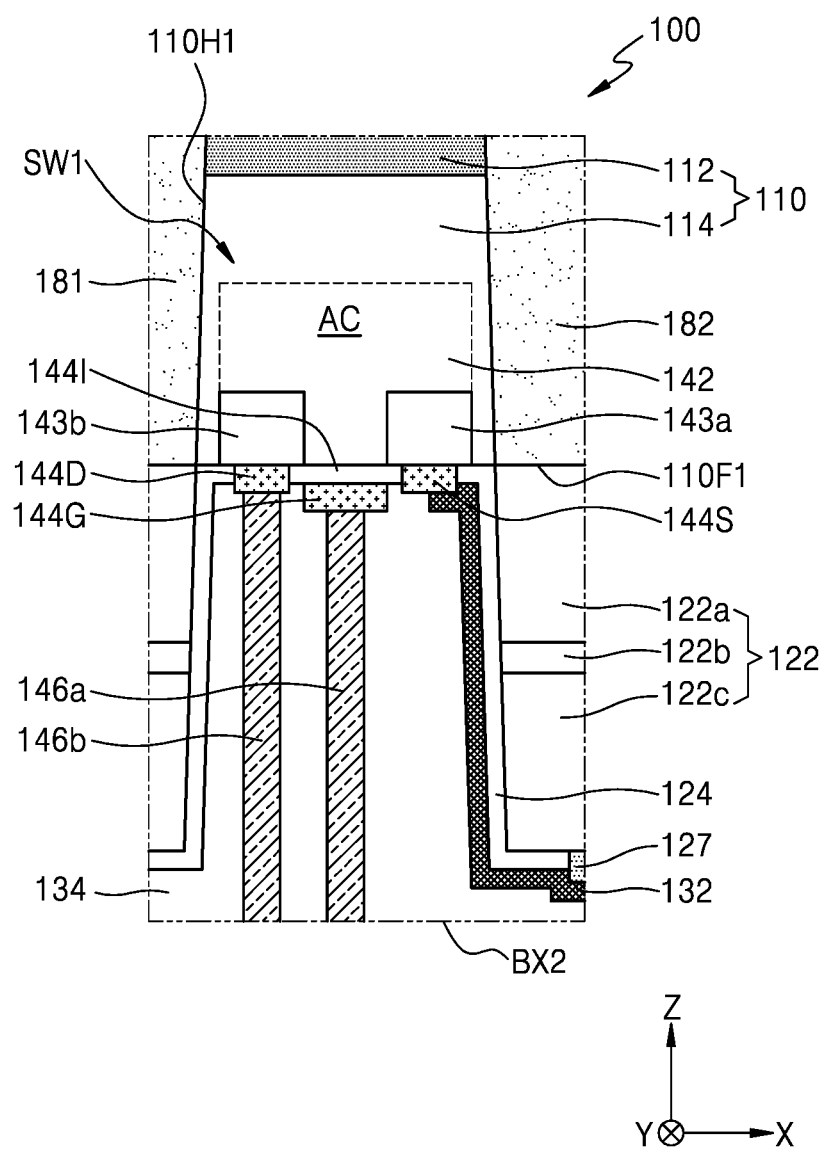
FIG. 8 is an enlarged view of portion BX2 in FIG. 6, according to an example embodiment.
Figure 9:
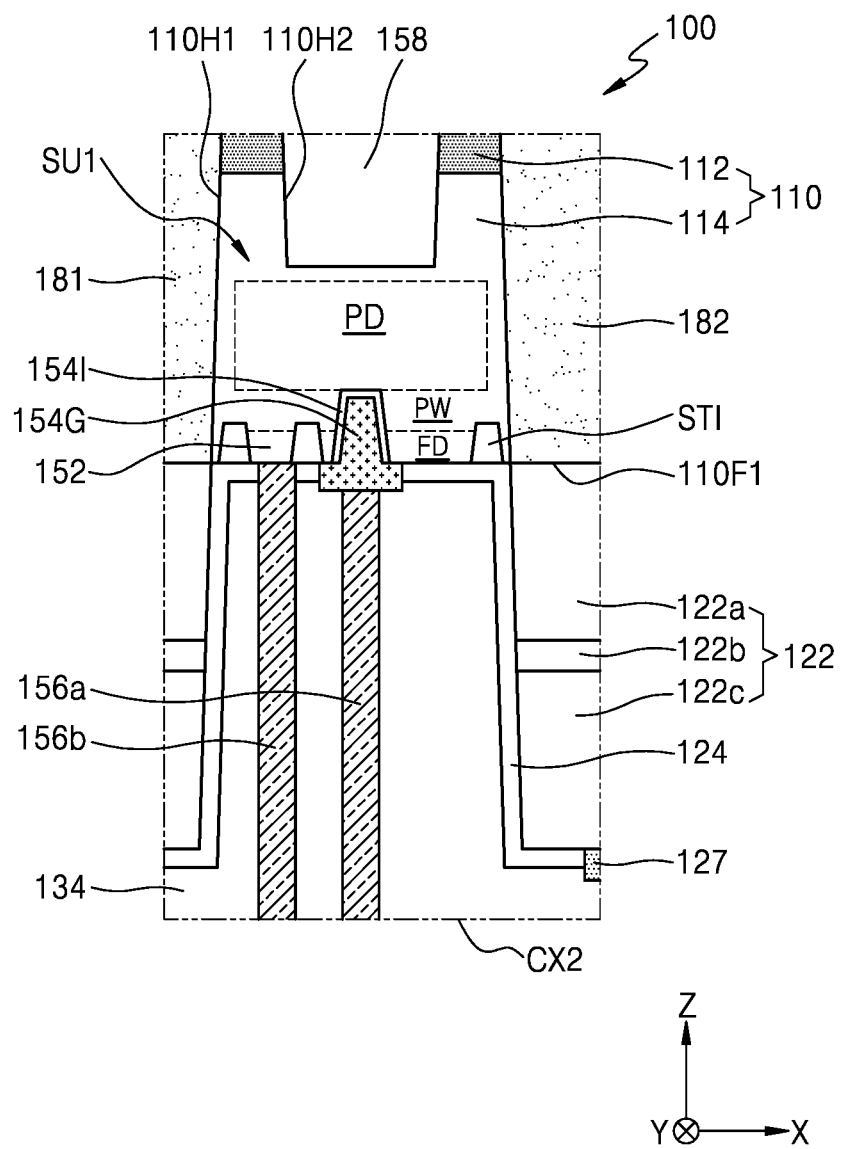
FIG. 9 is an enlarged view of portion CX2 in FIG. 7, according to an example embodiment.

FIG. 4 is a bottom plan view of a main configuration of a light-emitting device package 100 according to example embodiments. FIG. 5 is a cross-sectional view taken along line A1-A1' of FIG. 4, FIG. 6 is a cross-sectional view taken along line B1-B1' of FIG. 4, and FIG. 7 is a cross-sectional view taken along line C1-C1' of FIG. 4. FIG. 8 is an enlarged view of a portion BX2 in FIG. 6, and FIG. 9 is an enlarged view of a portion CX2 in FIG. 7. The light-emitting device package 100 may be a portion of the display panel 10 corresponding to one pixel PX of the display device 1 described with reference to FIGS. 1 and 2.

Referring to FIGS. 4 to 9, a first subpixel SPX1, a second subpixel SPX2, and a third subpixel SPX3 may be successively spaced in the X direction. The first subpixel SPX1 may include a first light-emitting structure LS1, a first switch SW1 and a first sensor SU1, the second subpixel SPX2 may include a second light-emitting structure LS2, a second switch SW2 and a second sensor SU2, and the third subpixel SPX3 may include a third light-emitting structure LS3, a third switch SW3 and a third sensor SU3.

In the first subpixel SPX1, the first light-emitting structure LS1 and the first sensor SU1 may be horizontally or laterally arranged. As shown in FIG. 4, the first light-emitting structure LS1 and the first sensor SU1 may not vertically overlap each other. Also, in the first subpixel SPX1, the first light-emitting structure LS1 and the first switch SW1 may be horizontally arranged.

As shown in FIG. 4, a first common pad PA1 commonly connected to second conductive type semiconductor layers 122c of the first to third light-emitting structures LS1, LS2, and LS3 may overlap an end of each of the first to third light-emitting structures LS1, LS2, and LS3 in a plan view, and a second common pad PA2 commonly connected to first conductive type semiconductor layers 122a of the first to third light-emitting structures LS1, LS2, and LS3 may overlap the other ends of the first to third light-emitting structures LS1, LS2, and LS3 in a plan view. First to third connection pads PB1, PB2, and PB3 may be arranged on the first to third switches SW1, SW2, and SW3, respectively, and fourth to sixth connection pads PC1, PC2, and PC3 may be arranged on the first to third sensors SU1, SU2, and SU3, respectively. However, the arrangements and shapes of the first and second common pads PA1 and PA2 and the first to sixth connection pads PB1, PB2, PB3, PC1, PC2, and PC3 are not limited thereto. For example, the first and fourth connection pads PB1 and PC1 may be connected to each other to form one pad.

A substrate 110 may function as a support substrate for supporting the first to third light-emitting structures LS1, LS2, and LS3, and may also function as a wall structure for separating the first to third light-emitting structures LS1, LS2, and LS3. For example, the substrate 110 may have a first surface 110F1 and a second surface 110F2 which are opposite to each other, and may have a plurality of first openings 110H1 and a plurality of second openings 110H2 (see FIG. 7). The first openings 110H1 may overlap the first to third light-emitting structures LS1, LS2, and LS3, respectively, in a plan view (for example, the first openings 110H1 may vertically overlap the first to third light-emitting structures LS1, LS2, and LS3, respectively), and the second openings 110H2 may overlap the first to third sensors SU1, SU2, and SU3, respectively, in a plan view.

The first to third light-emitting structures LS1, LS2, and LS3 may be positioned on the first surface 110F1 of the substrate 110 to overlap the plurality of first openings 110H1. As shown in FIG. 5, each of the first openings 110H1 may have a side wall that inclines at a certain angle with respect to the first surface 110F1 of the substrate 110 or may have a vertical side wall.

As shown in FIG. 5, the substrate 110 may include a semiconductor substrate 112 and an epitaxial semiconductor layer 114 positioned on the upper surface of the semiconductor substrate 112.

The semiconductor substrate 112 may include, for example, a Group IV semiconductor substrate doped with first impurities at a first concentration. The Group IV semiconductor substrate may include a silicon substrate, a silicon germanium (SiGe) substrate, a germanium (Ge) substrate, or a silicon carbide (SiC) substrate. For example, the semiconductor substrate 112 may be a silicon substrate oriented along the 11111 crystal plane of silicon.

The epitaxial semiconductor layer 114 may include a semiconductor layer grown on the semiconductor substrate 112 by an epitaxial growth process, and may include, for example, silicon. The epitaxial semiconductor layer 114 may be doped with, for example, second impurities at a second concentration lower than the first concentration. In example embodiments, the semiconductor substrate 112 may include p-type impurities, and the epitaxial semiconductor layer 114 may include n-type impurities. However, the inventive concept is not limited thereto.

The substrate 110, which has a structure in which the semiconductor substrate 112 and the epitaxial semiconductor layer 114 are stacked, may be a growth substrate or a template substrate for the formation of the first to third light-emitting structures LS1, LS2, and LS3. For example, an exposed surface of the epitaxial semiconductor layer 114 of the substrate 110 may correspond to the first surface 110F1 of the substrate 110, and an exposed surface of the semiconductor substrate 112 may correspond to the second surface 110F2 of the substrate 110. The first to third light-emitting structures LS1, LS2, and LS3 may be positioned on the first surface 110F1 (i.e., the exposed surface of the epitaxial semiconductor layer 114) of the substrate 110.

Each of the first to third light-emitting structures LS1, LS2, and LS3 may include a light-emitting stack 122, and the light-emitting stack 122 may include a first conductive type semiconductor layer 122a, an active layer 122b, and a second conductive type semiconductor layer 122c, sequentially arranged on the first surface 110F1 of the substrate 110. The light-emitting stack 122 may include a mesa etching portion 122E in which a portion of the light-emitting stack 122 is removed, and a bottom portion of the mesa etching portion 122E may extend to the upper surface of the first conductive type semiconductor layer 122a.

The first conductive type semiconductor layer 122a may be a nitride semiconductor having a composition of n-type $In_xAl_yGa_{(1-x-y)}N$ ($0 \leq x < 1$, $0 \leq y < 1$, and $0 \leq x+y < 1$), and the n-type impurities may be, for example, silicon (Si). For example, the first conductive type semiconductor layer 122a may include GaN including n-type impurities.

In example embodiments, the first conductive type semiconductor layer 122a may include a first conductive type semiconductor contact layer and a current diffusion layer. The impurity concentration of the first conductive type semiconductor contact layer may be in the range of about $2 \times 10^{18}$ cm$^{-3}$ to about $9 \times 10^{19}$ cm$^{-3}$. The thickness of the first conductive type semiconductor contact layer may be about 1 μm to about 5 μm. The current diffusion layer may have a structure in which a plurality of $In_xAl_yGa_{(1-x-y)}N$ layers ($0 \leq x$, $y \leq 1$, and $0 \leq x+y \leq 1$) having different compositions or having different impurity contents are alternately stacked. For example, the current diffusion layer may have an n-type superlattice structure in which an n-type GaN layer having a thickness of about 1 nm to about 500 nm and/or an $Al_xIn_yGa_zN$ layer ($0 \leq x, y, z \leq 1$ and $x+y+z \neq 0$) having a thickness of about 1 nm to about 500 nm are alternately stacked. The impurity concentration of the current diffusion layer may be about $2 \times 10^{18}$ cm about $9 \times 10^{19}$ cm$^{-3}$.

The active layer 122b may be positioned between the first conductive type semiconductor layer 122a and the second conductive type semiconductor layer 122c, and may emit light having a certain energy by recombination of electrons and holes. The active layer 122b may have a multiple quantum well (MQW) structure in which a quantum well layer and a quantum barrier layer are alternately stacked. For example, the quantum well layer and the quantum barrier layer may include $In_xAl_yGa_{(1-x-y)}N$ ($0 \leq x, y \leq 1$, and $0 \leq x+y \leq 1$) having different compositions. For example, the quantum well layer may include $In_xGa_{1-x}N$ ($0 \leq x \leq 1$), and the quantum barrier layer may include GaN or AlGaN. The thicknesses of the quantum well layer and the quantum barrier layer may be in the range of about 1 nm to about 50 nm. The active layer 122b is not limited to the MQW structure, but may have a single quantum well structure.

The second conductive type semiconductor layer 122c may be a nitride semiconductor layer having a composition of p-type $In_xAl_yGa_{(1-x-y)}N$ ($0 \leq x < 1$, $0 \leq y < 1$, and $0 \leq x+y < 1$), and the p-type impurities may be, for example, magnesium (Mg).

In example embodiments, the second conductive type semiconductor layer 122c may include an electron blocking layer, a low-concentration p-type GaN layer, and a high-concentration p-type GaN layer provided as a contact layer. For example, the electron blocking layer may have a structure in which a plurality of $In_xAl_yGa_{(1-x-y)}N$ layers ($0 \leq x, y \leq 1$, and $0 \leq x+y \leq 1$) having thicknesses of about 5 nm to about 100 nm and having different compositions or different impurity contents are alternately stacked, or may be a single layer including $Al_yGa_{(1-y)}N$ ($0 < y \leq 1$). The energy band gap of the electron blocking layer may decrease as the distance from the active layer 122b increases. For example, the Al composition of the electron blocking layer may decrease as the distance from the active layer 122b increases.

An insulating layer 124 may be positioned on the upper surface and sidewalls of the light-emitting stack 122, and may also be conformally positioned on the inner wall of the mesa etching portion 122E. The insulating layer 124 may include silicon oxide or silicon nitride. Although the insulating layer 124 is shown in FIGS. 5 to 9 as a single material layer, the insulating layer 124 may be formed as a stacked structure of a plurality of insulating layers.

A first electrode 127 may be positioned on the upper surface of the second conductive type semiconductor layer 122c, and a second electrode 128 may be positioned on the upper surface of the first conductive type semiconductor layer 122a. Each of the first electrode 127 and the second electrode 128 may include Ag, Al, Ni, Cr, Cu, Au, Pd, Pt, Sn, W, Rh, Jr, Ru, Mg, Zn, or a combination thereof. Each of the first electrode 127 and the second electrode 128 may include a metal material having high reflectivity. For example, the first electrode 127 and the second electrode 128 may be formed by etching a portion of the insulating layer 124 to expose the surfaces of the first and second conductive type semiconductor layers 122a and 122c and then depositing a conductive material on the exposed surfaces. Optionally, an ohmic electrode (not shown) may be further formed between the first electrode 127 and the second conductive type semiconductor layer 122c, and between the second electrode 128 and the first conductive type semiconductor layer 122a.

A connection electrode 132 may be positioned on the first electrode 127, and a molding member 134 may be positioned on the insulation layer 124, the first electrode 127, and the connection electrode 132. The molding member 134 may fill a space between adjacent light-emitting stacks 122 (for example, a space between each of the first to third light-emitting structures LS1, LS2, and LS3) and the mesa etching portion 122E. The molding member 134 may include a silicone resin, an epoxy resin, or an acrylic resin. A connection via 136 may be connected to the second electrode 128 through the molding member 134 in the mesa etching portion 122E.

A multi-layered insulating structure 162 may be positioned on the molding member 134. The multi-layered insulating structure 162 may include a first insulating layer 162a and a second insulating layer 162b which are sequentially arranged on the molding member 134. A wiring layer 164 may be formed between the first insulating layer 162a and the second insulating layer 162b, and conductive vias 166a, 166b, 166c, and 166d may be formed to pass through at least a portion of the multi-layered insulating structure 162. The first and second common pads PA1 and PA2 and the first to sixth connection pads PB1, PB2, PB3, PC1, PC2, and PC3, which are electrically connected to corresponding conductive vias 166a, 166b, 166c, and 166d, may be positioned on the multi-layered insulating structure 162. The multi-layered insulating structure 162 may be separately formed in a same manner as a printed circuit board, and attached to the molding member 134. However, the inventive concept is not limited thereto.

First to third wavelength conversion layers 181, 182, and 183 may be positioned in the plurality of first openings 110H1. The first to third wavelength conversion layers 181, 182, and 183 may cover the first to third light-emitting structures LS1, LS2, and LS3, respectively, and may include different materials capable of converting light emitted from the first to third light-emitting structures LS1, LS2, and LS3 into desired colors. For example, the first to third wavelength conversion layers 181, 182, and 183 may include phosphors capable of converting light emitted from the first to third light-emitting structures LS1, LS2, and LS3 into red (R) light, green (G) light, and blue (B) light, respectively.

Each of the first to third wavelength conversion layers 181, 182, and 183 may include a resin containing a phosphor dispersed therein or a film containing a phosphor. For example, each of the first to third wavelength conversion layers 181, 182, and 183 may include a phosphor film in which phosphor particles are uniformly dispersed at a certain concentration. The first to third wavelength conversion layers 181, 182 and 183 may include two or more kinds of phosphor particles having different size distributions in order to improve the density of the phosphor particles and improve color uniformity.

The phosphor particles may have the following composition formulas and colors.

Oxide-based: yellow color and green color $Y_3Al_5O_{12}$:Ce, $Tb_3Al_5O_{12}$:Ce, $Lu_3Al_5O_{12}$:Ce Silicate-based: yellow color and green color $(Ba,Sr)_2SiO_4$:Eu, yellow color and orange color $(Ba,Sr)_3SiO_5$:Ce Nitride-based: green color β-SiAlON:Eu, yellow color $La_3Si_6N_{11}$:Ce, orange color α-SiAlON:Eu, red color $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, and $0 < y \leq 4$)  Formula (1)

In Formula (1), Ln may be at least one element selected from the group consisting of Group Ma elements and rare-earth elements, and M may be at least one element selected from the group consisting of calcium (Ca), barium (Ba), strontium (Sr), and magnesium (Mg).

Fluoride-based: KSF-based red color $K_2SiF_6:Mn_4^+$, $K_2TiF_6:Mn_4^+$, $NaYF_4:Mn_4^+$, $NaGdF_4:Mn_4^+$, $K_3SiF_7:Mn_4^+$ The compositions of the phosphors have to basically conform with stoichiometry, and the respective elements may be substituted by other elements included in the respective groups of the periodic table. For example, strontium (Sr) may be substituted by at least one selected from barium (Ba), calcium (Ca), and magnesium (Mg) of alkaline-earth group II, and Y may be substituted by at least one selected from terbium (Tb), lutetium (Lu), scandium (Sc), and gadolinium (Gd), which are lanthanide. In addition, europium (Eu), which is an activator, may be substituted by at least one selected from cerium (Ce), terbium (Tb), praseodymium (Pr), erbium (Er), and ytterbium (Yb) according to a desired energy level. The activator may be applied solely or a sub-activator may be additionally applied for characteristic modification.

In particular, a fluoride-based red phosphor may be coated with a manganese-free fluoride to improve reliability at a high temperature and a high humidity. Alternatively, the surface of the fluoride-based red phosphor or the surface of the manganese-free fluoride coating layer may be further coated with an organic material. Unlike other phosphors, the fluoride-based red phosphor may realize a narrow full-width at half-maximum of about 40 nm or less and thus may be applied to a high-resolution TV, such as an ultrahigh-definition (UHD) TV.

Figure 25:
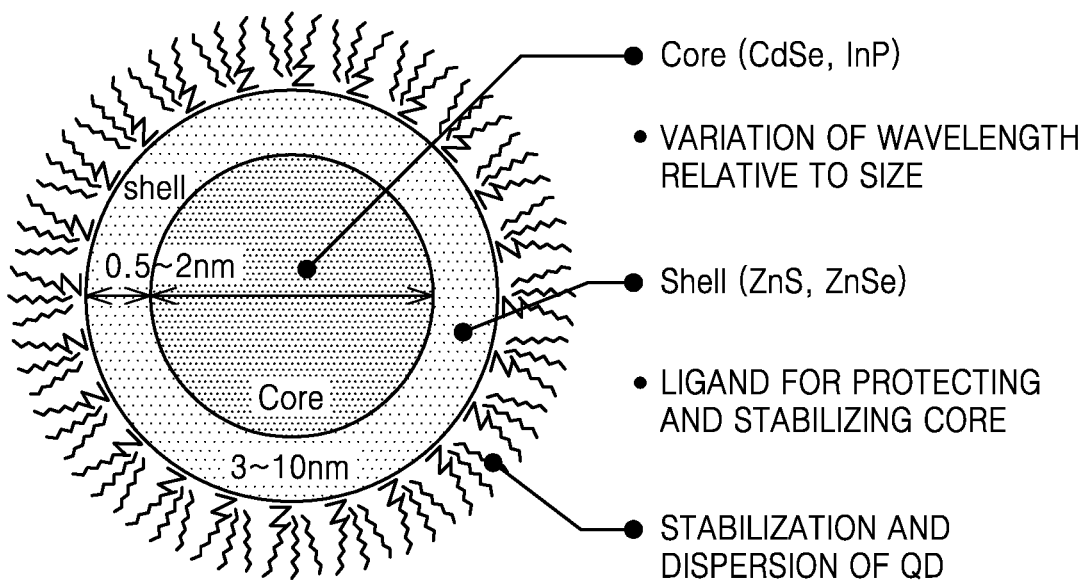
FIG. 25 is a schematic diagram illustrating a cross-sectional structure of a quantum dot (QD) that may be used

FIG. 25 is a schematic diagram illustrating a cross-sectional structure of a quantum dot (QD) that may be used as a wavelength converting material in a light-emitting device package according to example embodiments.

Referring to FIG. 25, the quantum dot (QD) may have a core-shell structure using a III-V or II-VI compound semiconductor. For example, the quantum dot may have a core such as CdSe or InP and a shell such as ZnS or ZnSe. In addition, the quantum dot may include a ligand for stabilizing the core and the shell. For example, the diameter of the core may be about 1 nm to about 30 nm, and more particularly, about 3 nm to about 10 nm. The thickness of the shell may be about 0.1 nm to about 20 nm, and more particularly, about 0.5 nm to about 2 nm.

The quantum dot may realize various colors depending on its size. In particular, when the quantum dot is used as a substitute for a phosphor, the quantum dot may be used as a red or green phosphor. By using the quantum dot, a narrow full-width at half-maximum (for example, about 35 nm) may be realized.

Referring back to FIGS. 4 to 9, an encapsulation layer 186 may be positioned on the wavelength conversion layers 181, 182, and 183 and the second surface 110F2 of the substrate 110.

As shown in FIGS. 6 and 8, an active region AC for the first to third switches SW1, SW2, and SW3 may be defined in the substrate 110 positioned on one side of each of the first to third light-emitting structures LS1, LS2, and LS3. The first to third switches SW1, SW2, and SW3 may include driving transistors for driving the first to third light-emitting structures LS1, LS2, and LS3, respectively.

The active region AC may include a p-well 142, formed in the inside of the substrate 110 adjacent to the first surface 110F1 of the substrate 110 and doped with p-type impurities. Although not shown in drawings, the active region AC may further include an n-pocket (not shown) that surrounds the p-well 142 and is doped with n-type impurities.

A gate insulating layer 144I and a gate electrode 144G may be sequentially arranged on the active region AC. A source electrode 144S and a drain electrode 144D may be positioned on the first surface 110F1 of the substrate 110 on both sides of the gate electrode 144G. Source and drain regions 143a and 143b may be formed in the active region AC under the source electrode 144S and the drain electrode 144D. Connection vias 146a and 146b may be formed on the gate electrode 144G and the drain electrode 144D, and the connection vias 146a and 146b may be electrically connected to conductive vias 166c and 166d corresponding thereto.

As the active region AC for the first to third switches SW1, SW2, and SW3 is formed in the substrate 110, an additional substrate (e.g., a separate thin film transistor (TFT) substrate) including the driving transistor for driving the first to third light-emitting structures LS1, LS2, and LS3 may be omitted, and the display panel 10 including the light-emitting device package 100 may be formed to have a small thickness.

As shown in FIGS. 7 and 9, a device region (not shown) for the first to third sensors SU1, SU2, and SU3 may be defined in the substrate 110 positioned on one side of each of the first to third light-emitting structures LS1, LS2, and LS3. The sensors SU1, SU2, and SU3 may include image sensors for sensing light that is emitted from the first to third light-emitting structures LS1, LS2, and LS3 and reflected by an object (e.g., a fingerprint) placed on a display panel.

A photoelectric conversion region PD and a well region PW may be positioned in the substrate 110. The photoelectric conversion region PD and the well region PW may be located in a region vertically overlapping the plurality of second openings 110H2. A device isolation layer STI having a certain depth from the first surface 110F1 of the substrate 110 to the inside of the substrate 110 may be positioned, and an impurity region 152 and a floating diffusion region FD may be defined by the device isolation layer STI. A transfer transistor gate 154G may be positioned between the impurity region 152 and the floating diffusion region FD, and a transfer transistor gate insulating layer 154I may be between the transfer transistor gate 154G and the substrate 110. The transfer transistor gate 154G may have a recess-type gate structure that fills a recess formed in the substrate 110.

Connection vias 156a and 156b may be formed on the transfer transistor gate 154G and the impurity region 152, and the connection vias 156a and 156b may be electrically connected to conductive vias 166c and 166d corresponding thereto.

Hereinafter, a driving method of a sensor will be briefly described with reference to FIG. 10.

Figure 10:
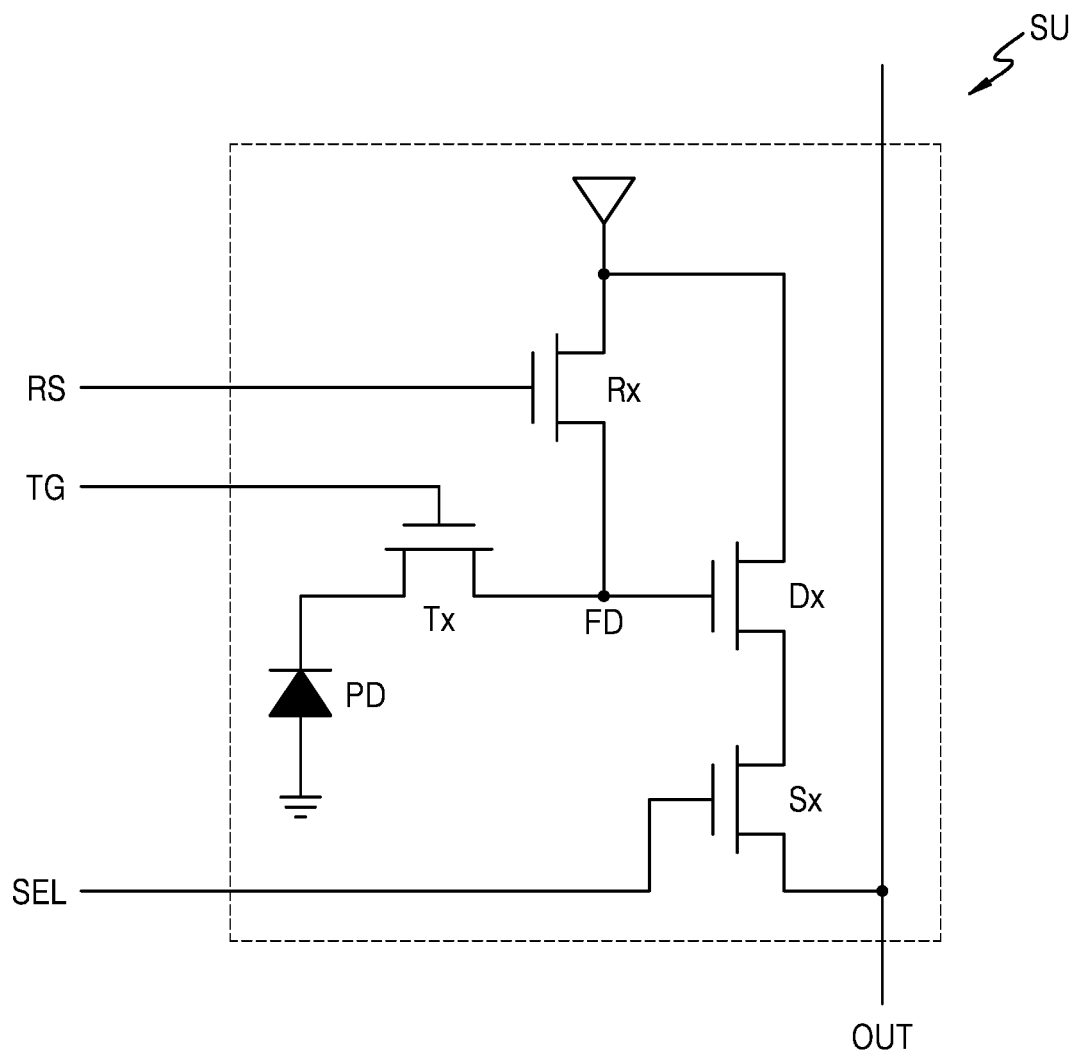
FIG. 10 is a circuit diagram of an sensor according to an example embodiment.

FIG. 10 is a circuit diagram of a sensor SU according to example embodiments.

Referring to FIG. 10, the sensor SU includes a photoelectric conversion region PD for receiving light, generating charges by photoelectric conversion, and storing the generated charges, a transfer transistor Tx for transferring the charges generated in the photoelectric conversion region PD to a floating diffusion region FD, a reset transistor Rx for periodically resetting charges stored in the floating diffusion region FD, a drive transistor Dx serving as a source follower buffer amplifier and for buffering a signal according to charges charged in the floating diffusion region FD, and a selection transistor Sx performing a switching and addressing function for selecting a pixel PX (see FIG. 2).

The photoelectric conversion region PD may be a photodiode including an N-type impurity region and a P-type impurity region. The floating diffusion region FD may be the source of the reset transistor Rx, and the floating diffusion region FD may be connected to the gate of the drive transistor Dx. Referring to FIG. 10, a reset signal RS is applied to the gate of the reset transistor Rx, a transfer signal TG is applied to the gate of the transfer transistor Tx, and a selection signal SEL is applied to the gate of the selection transistor Sx. The reset transistor Rx, the drive transistor Dx, and the selection transistor Sx may be shared by neighboring pixels.

In a state in which light is blocked, when a power supply voltage is applied to the drain of the reset transistor Rx and the drain of the drive transistor Dx, and the reset transistor Rx is turned on, charges remaining in the floating diffusion region FD may be discharged. Then, when the reset transistor Rx is turned off, and light is incident on the photoelectric conversion region PD, electron hole pairs may be generated in the photoelectric conversion region PD by the incident light. Holes may move to the P-type impurity region and be accumulated therein, and electrons may move to the N-type impurity region and be accumulated therein. By turning on the transfer transistor Tx, electrons may be transferred to the floating diffusion region FD and/or be accumulated therein. A gate bias of the drive transistor Dx may be changed depending on the amount of accumulated charges, and thus, a source potential of the drive transistor Dx may be changed. In this case, the selection transistor Sx may be turned on to thereby output a signal OUT caused by charges.

Referring back to FIGS. 7 and 9, the first to third sensors SU1, SU2, and SU3 may be arranged at positions overlapping the plurality of second openings 110H2, and a light guide insulating layer 158 may be positioned in the plurality of second openings 110H2. The light guide insulating layer 158 may have an upper surface coplanar with the wavelength conversion layers 181, 182, and 183 and the second surface 110F2 of the substrate 110.

The plurality of second openings 110H2 and the light guide insulating layer 158 filling the plurality of second openings 110H2 may collectively be referred to as a light guide portion 158G. The light guide portion 158G may provide a light path so that light incident into the plurality of second openings 110H2 may reach the photoelectric conversion area PD without loss of light quantity. The light guide portion 158G may be provided in the substrate 110 by the plurality of second openings 110H2, and accordingly, although a separate or additional lens for condensing light is not formed on the substrate 110, a sufficient amount of light may be transmitted to the first to third sensors SU1, SU2, and SU3 to recognize a fingerprint.

Recently, an optical fingerprint sensing method has been developed to lighten the weight of a portable electronic device such as a smart phone or a wearable device or to enlarge a display area. For the optical fingerprint sensing method, a fingerprint sensor substrate in which an image sensor is formed is attached, along with an intermediate substrate in which a light guide path is formed, to a bottom surface of a display panel such as an organic light-emitting device (OLED) panel. In this case, the thicknesses of the fingerprint sensor substrate and the intermediate substrate are relatively large, and thus, the thickness of a display device may increase.

However, in the light-emitting device package 100 according to the above-described example embodiments, as the first to third sensors SU1, SU2, and SU3 are formed in the first to third subpixels SPX1, SPX2, and SPX3, respectively, the same number of sensors (i.e., the first to third sensors SU1, SU2, and SU3) as that of light-emitting structures (i.e., the first to third light-emitting structures LS1, LS2, and LS3) may be formed and a high-resolution fingerprint recognition sensor may be realized. In addition, the first to third light-emitting structures LS1, LS2, and LS3 and the first to third sensors SU1, SU2, and SU3 are horizontally arranged in a pixel, so that the first to third sensor SU1, SU2, and SU3 may be formed in a relatively large area in the pixel, and thus, fingerprint recognition performance may be improved.

In addition, the first to third sensors SU1, SU2, and SU3 may be arranged in the substrate 110 serving as a support substrate and a wall structure of the first to third light-emitting structures LS1, LS2, and LS3 and the light guide portion 158G for the first to third sensors SU1, SU2, and SU3 may be provided by the second opening 110H2 formed in the substrate 110, and thus, the thickness of a display panel may be reduced.

Figure 11:
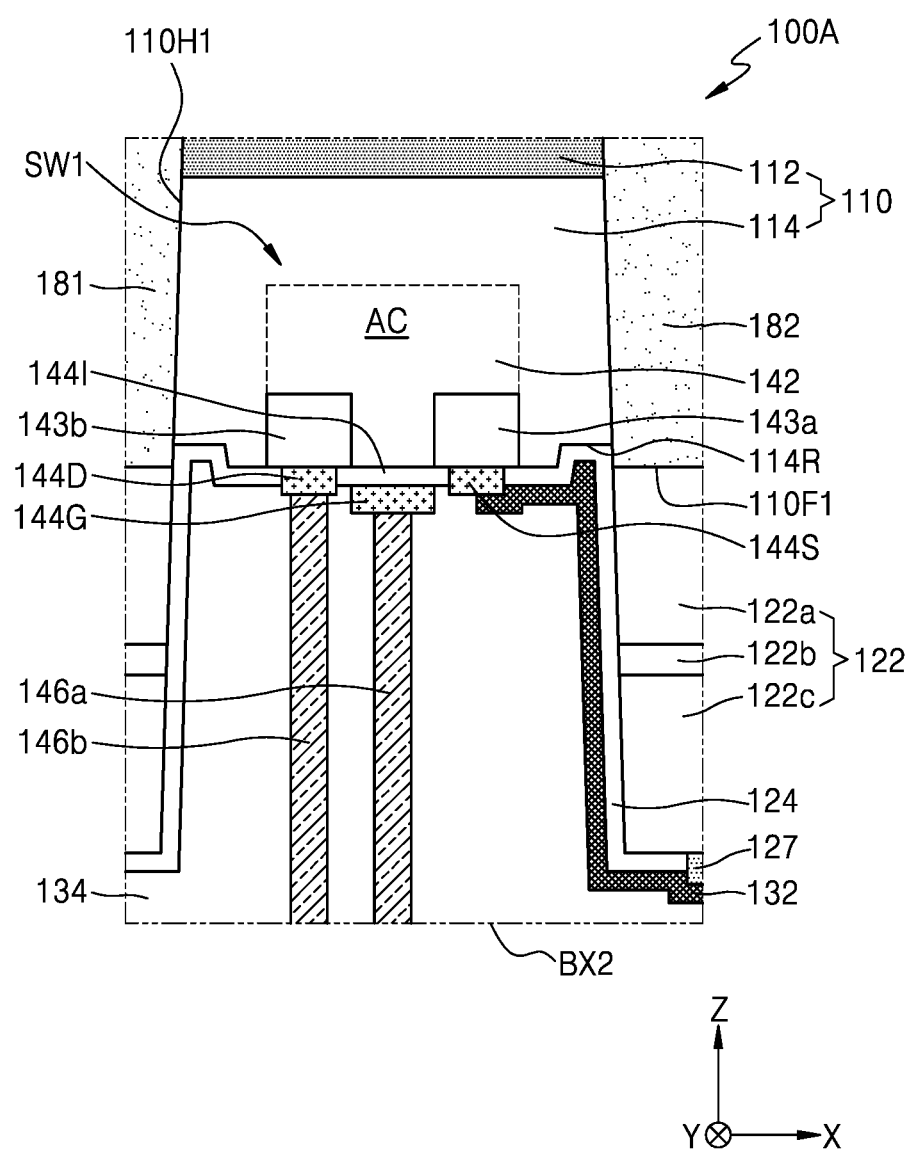
FIGS. 11 and 12 are cross-sectional views of a light-emitting device package according to example embodiments.
Figure 12:
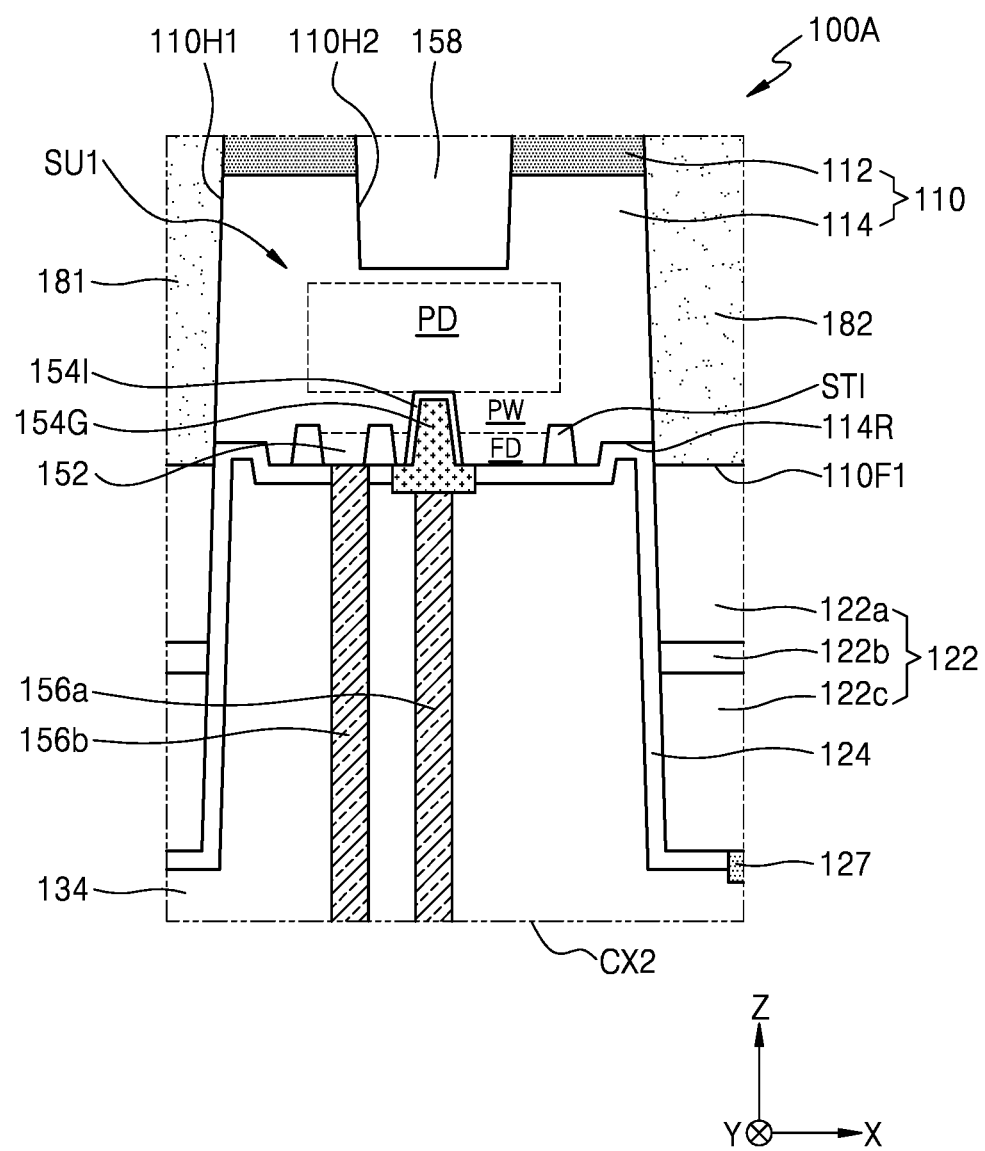

FIGS. 11 and 12 are cross-sectional views of a light-emitting device package 100A according to example embodiments. FIGS. 11 and 12 respectively show a cross section corresponding to the enlarged view of the portion BX2 in FIG. 6 and a cross section corresponding to the enlarged view of the portion CX2 in FIG. 7. In FIGS. 11 and 12, the same reference numerals as in FIGS. 1 to 10 denote the same components.

Referring to FIGS. 11 and 12, a recessed region 114R may be formed in a first surface 110F1 of a substrate 110 surrounding a light-emitting stack 122. The recessed region 114R may be positioned in an edge portion of the substrate 110 corresponding to a switch SW1 and a sensor SU1. The recessed region 114R may be formed by over-etching a portion of the upper surface of an epitaxial semiconductor layer 114 serving as a growth substrate in a process for etching the light-emitting stack 122.

Although an example in which an insulating layer 124 is conformally arranged in the recessed region 114R is illustrated in FIGS. 11 and 12, the insulating layer 124 may be formed only on a sidewall of the recessed region 114R.

Figure 13:
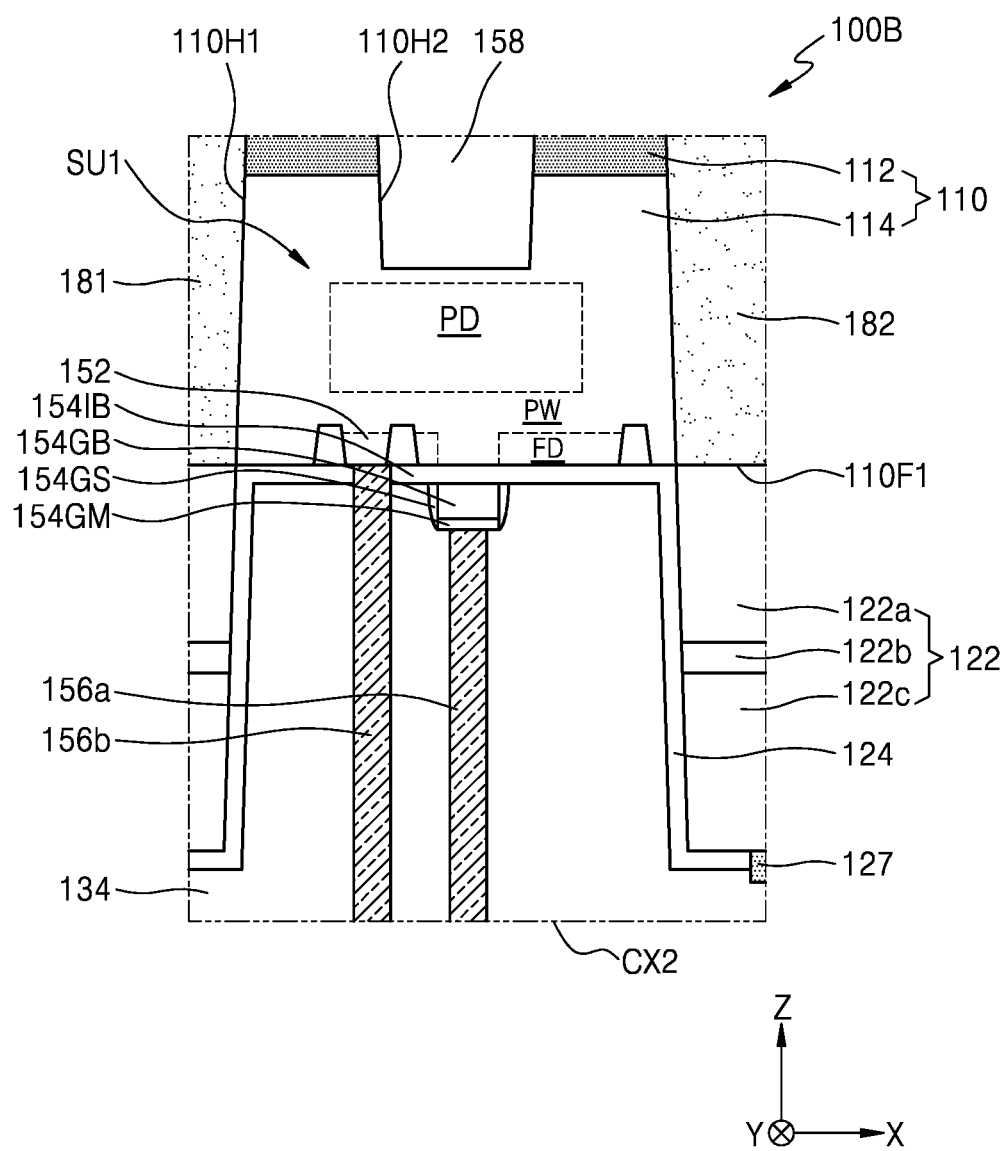
FIG. 13 is a cross-sectional view of a light-emitting device package according to example embodiments.

FIG. 13 is a cross-sectional view of a light-emitting device package 100B according to example embodiments. FIG. 13 shows a cross section corresponding to the enlarged view of the portion CX2 in FIG. 7. In FIG. 13, the same reference numerals as in FIGS. 1 to 12 denote the same components.

Referring to FIG. 13, a sensor SU1 may have a planar-type transfer transistor gate 154GB. The transfer transistor gate 154GB may be positioned on a gate insulating layer 154IB formed on a first surface 110F1 of a substrate 110, a gate spacer 154GS may be positioned on both sidewalls of the transfer transistor gate 154GB, and a capping layer 154GM may be further positioned on the upper surface of the transfer transistor gate 154GB.

In an example, the gate insulating layer 154IB may be formed in the same process as an insulating layer 124, or may include the same material as the insulating layer 124. Alternatively, the gate insulating layer 154IB may be formed by depositing an insulating material on the first surface 110F1 of the substrate 110 from which the insulating layer 124 has been removed.

Figure 14:
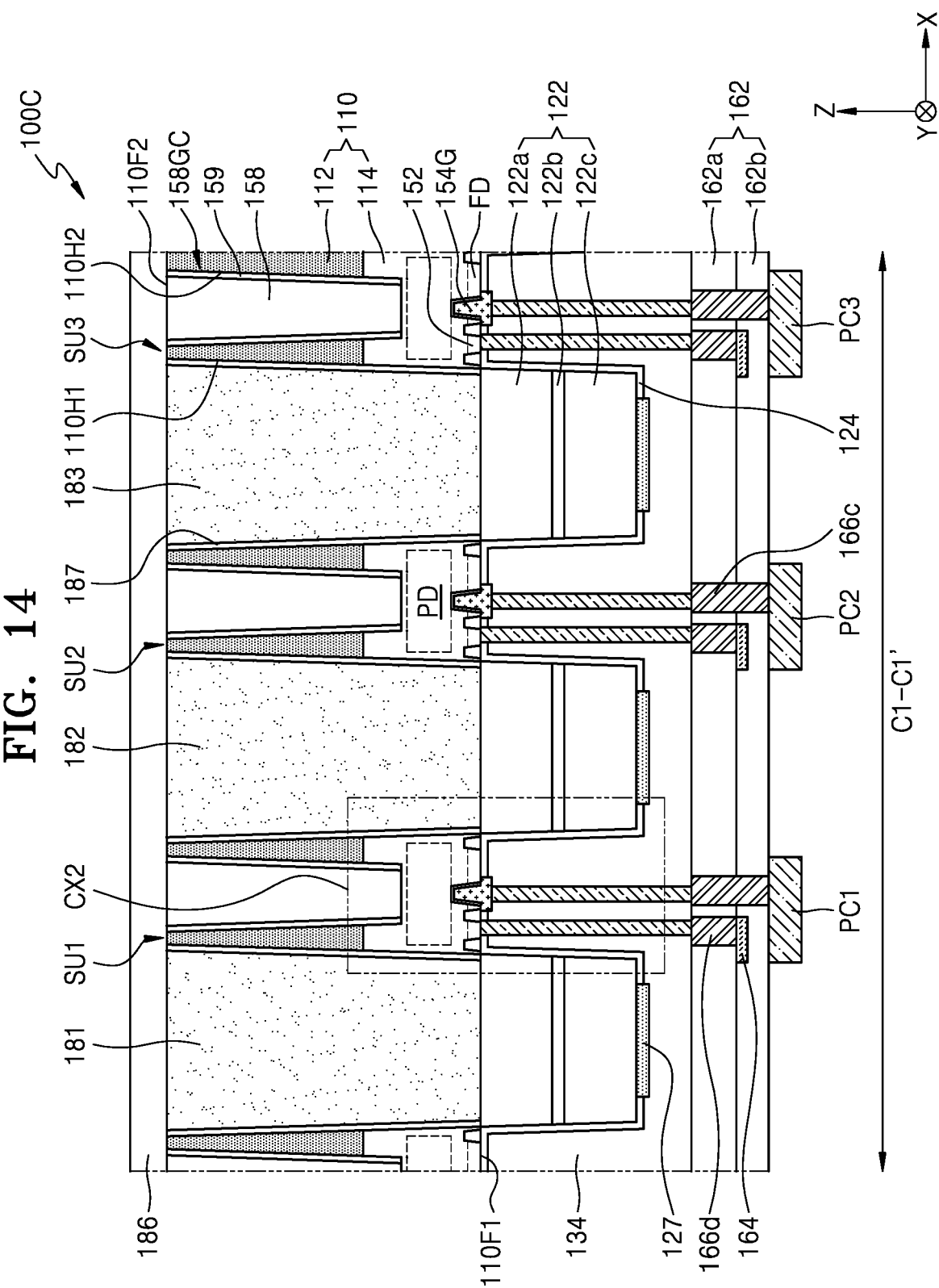
FIG. 14 is a cross-sectional view of a light-emitting device package according to an example embodiment.

FIG. 14 is a cross-sectional view of a light-emitting device package 100C according to example embodiments. FIG. 14 shows a cross section corresponding to a cross section taken along line C1-C1' in FIG. 4. In FIG. 14, the same reference numerals as in FIGS. 1 to 13 denote the same components.

Referring to FIG. 14, a reflective layer 187 may be positioned on the inner walls of a plurality of first openings 110H1. The reflective layer 187 may reflect light emitted from a light-emitting stack 122, thereby improving light extraction efficiency.

In example embodiments, the reflective layer 187 may be a metal layer including Ag, Al, Ni, Cr, Au, Pt, Pd, Sn, W, Rh, Ir, Ru, Mg, Zn, or a combination thereof. In other embodiments, the reflective layer 187 may be a resin layer such as polyphthalamide (PPA) containing a metal oxide such as titanium oxide or aluminum oxide. In other embodiments, the reflective layer 187 may be a distributed Bragg reflector layer. For example, the distributed Bragg reflector layer may have a structure in which a plurality of insulating films having different refractive indexes are repeatedly stacked several to several hundred times. Each of the insulating films in the distributed Bragg reflector layer may include an oxide or nitride such as $SiO_2$, SiN, $SiO_xN_y$, $TiO_2$, $Si_3N_4$, $Al_2O_3$, TiN, AN, $ZrO_2$, TiAlN or TiSiN, or a combination thereof.

Optionally, a light guide portion 158GC may include a reflective layer 159 positioned on the inner walls of a plurality of second openings 110H2. The reflective layer 159 may include a material similar to that of the reflective layer 187.

Figure 15:
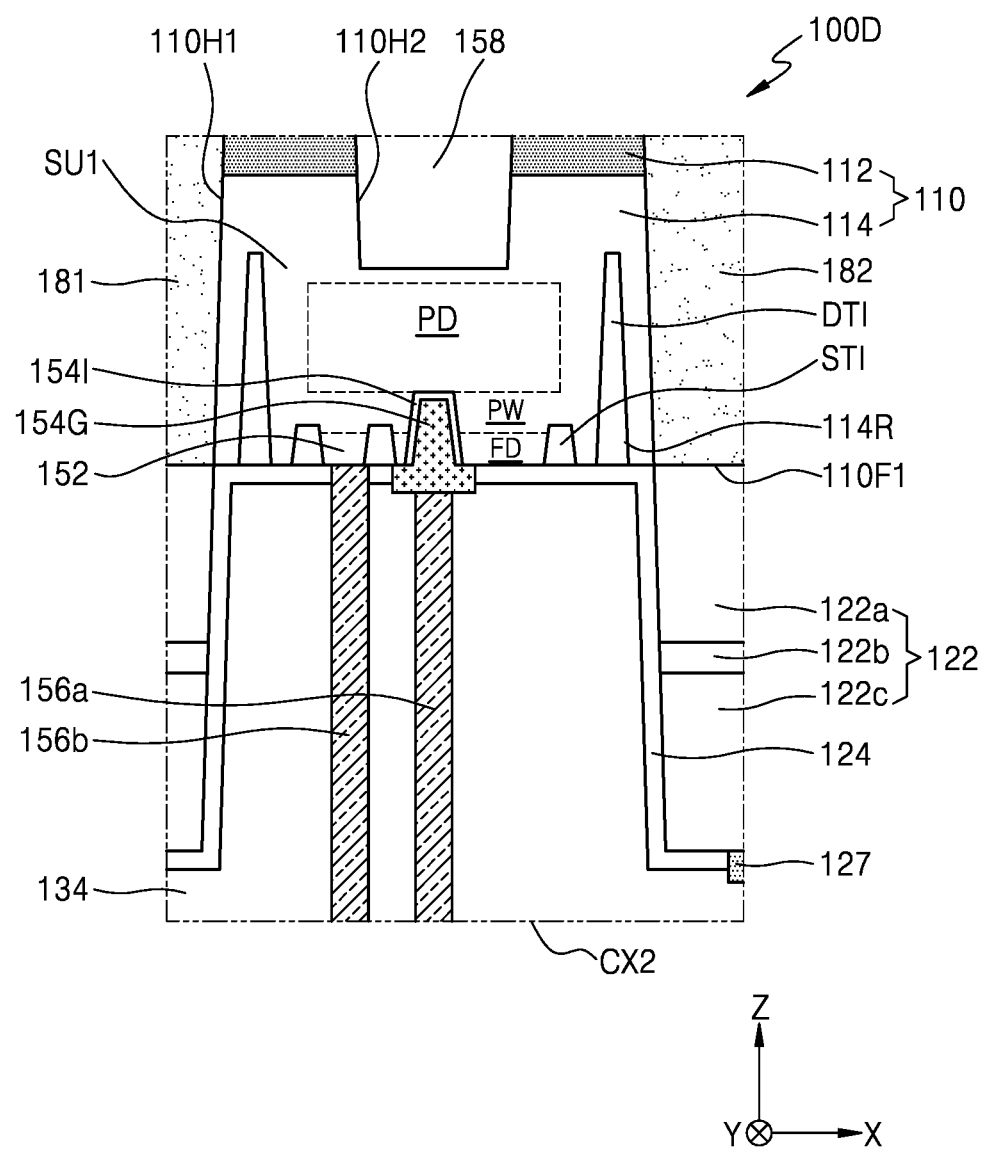
FIG. 15 is a cross-sectional view of a light-emitting device package according to an example embodiment.

FIG. 15 is a cross-sectional view of a light-emitting device package 100D according to example embodiments. FIG. 15 shows a cross section corresponding to the enlarged view of the portion CX2 in FIG. 7. In FIG. 15, the same reference numerals as in FIGS. 1 to 14 denote the same components.

Referring to FIG. 15, a sensor SU1 may further include a device isolation structure DTI. The device isolation structure DTI may fill the inside of a recess (not shown) extending from a first surface 110F1 of a substrate 110 to the inside of the substrate 110 of the sensor SU1. In example embodiments, the device isolation structure DTI may include an insulating layer filling the inside of the recess. In other embodiments, the device isolation structure DTI may include a conductive layer filling the inside of the recess, and a bias voltage may be applied to the conductive layer.

Figure 16:
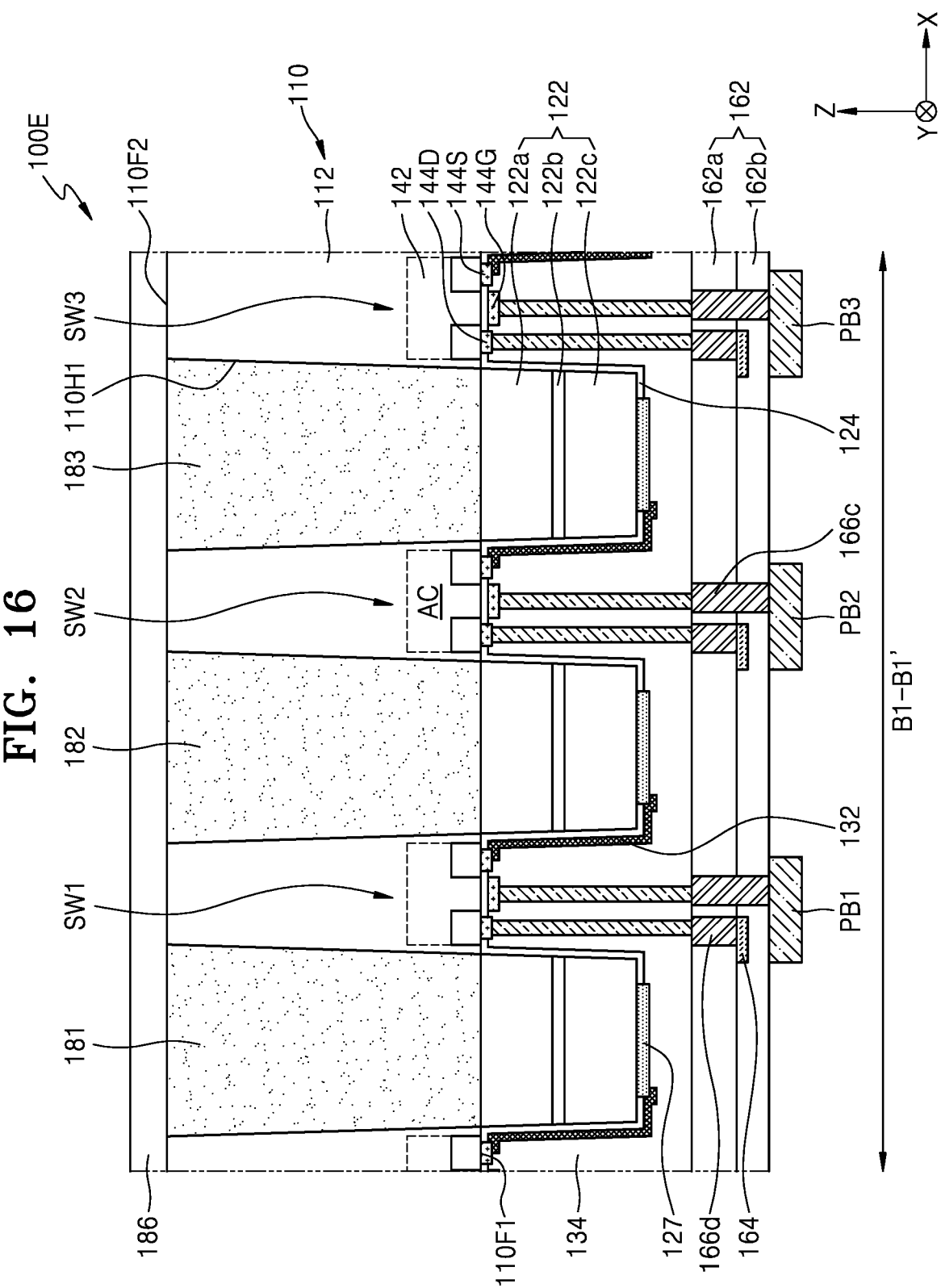
FIGS. 16 and 17 are cross-sectional views of a light-emitting device package according to example embodiments.
Figure 17:
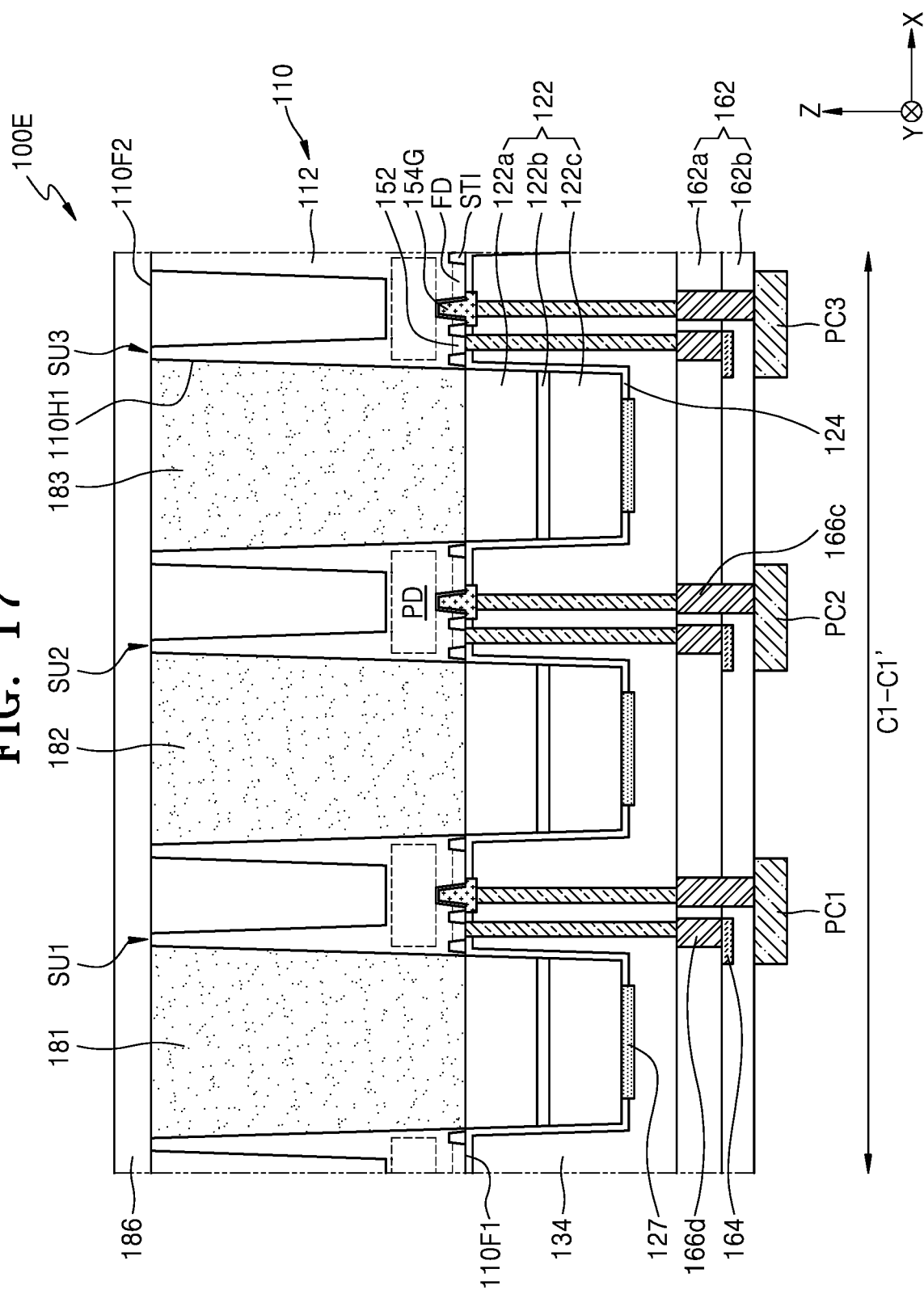

FIGS. 16 and 17 are cross-sectional views of a light-emitting device package 100E according to example embodiments. FIGS. 16 and 17 show a cross section corresponding to a cross section taken along the line B1-B1' of FIG. 4 and a cross section corresponding to a cross section taken along the line C1-C1' of FIG. 4, respectively. In FIGS. 16 and 17, the same reference numerals as in FIGS. 1 to 15 denote the same components.

Referring to FIGS. 16 and 17, a substrate 110 may include only a semiconductor substrate 112, and the epitaxial semiconductor layer 114 described with reference to FIGS. 4 to 9 may be omitted. For example, the semiconductor substrate 112 may serve as a growth substrate for growing a light-emitting stack 122, an active region AC for switches SW1, SW2, and SW3 may be formed in a portion of the semiconductor substrate 112, and a device region (not shown) for sensors SU1, SU2, and SU3 may be formed in a portion of the semiconductor substrate 112.

FIGS. 18A to 24C are cross-sectional views illustrating, in accordance with a process sequence, a method of manufacturing a light-emitting device package 100, according to exemplary embodiments. FIGS. 18A, 19A, 20A, 21A, 22A, 23A, and 24A are cross-sectional views corresponding to a cross section taken along the line A1-A1' in FIG. 4, FIGS. 18B, 19B, 20B, 21B, 22B, 23B, and 24B are cross-sectional views corresponding to a cross section taken along the line B1-B1' in FIG. 4, and FIGS. 18C, 19C, 20C, 21C, 22C, 23C, and 24C are cross-sectional views corresponding to a cross section taken along the line C1-C1' in FIG. 4.

Figure 18A:
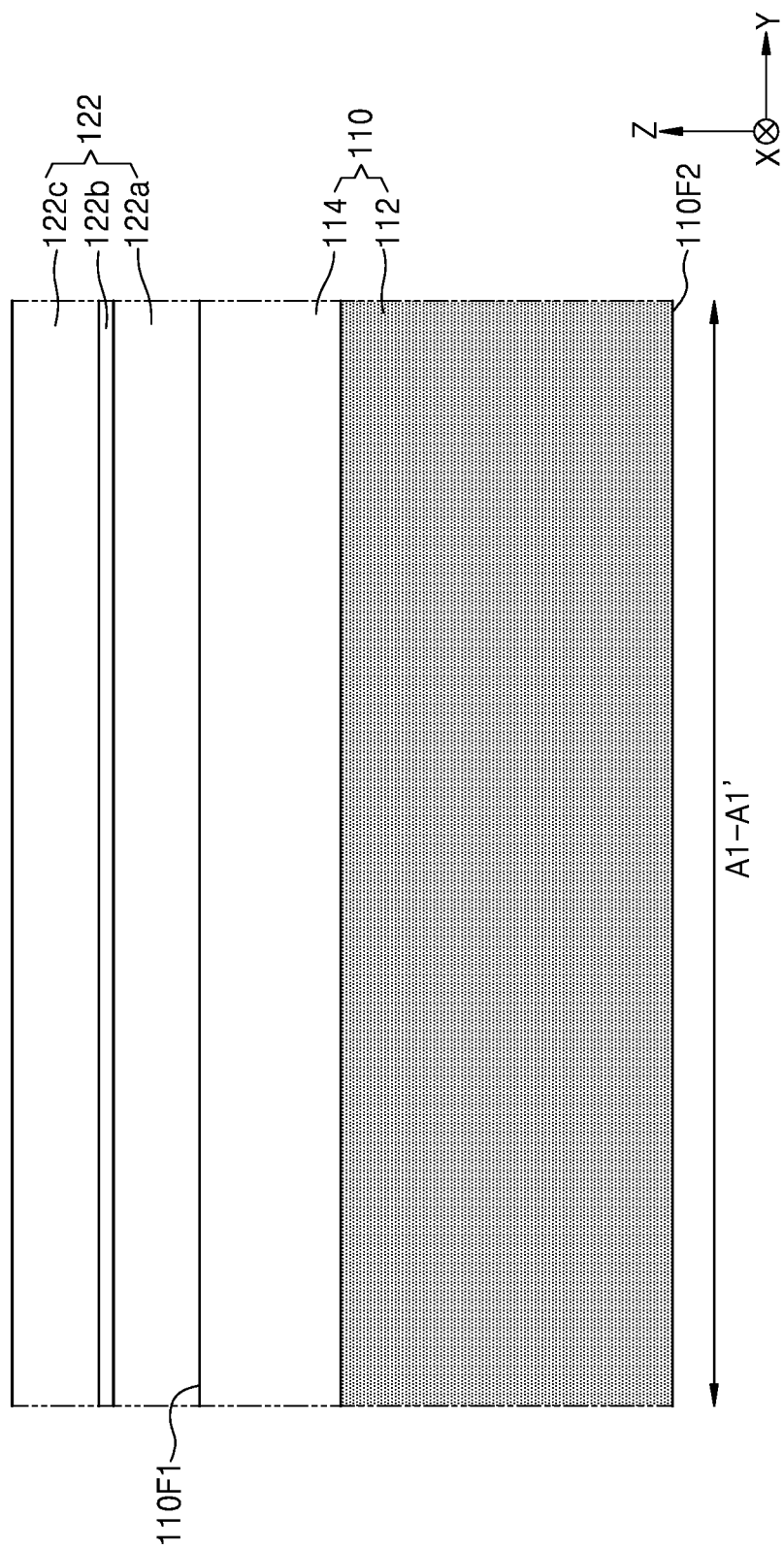
FIGS. 18A to 24C are cross-sectional views illustrating, in accordance with a process sequence, a method of manufacturing a light-emitting device package, according to example embodiments.
Figure 18B:
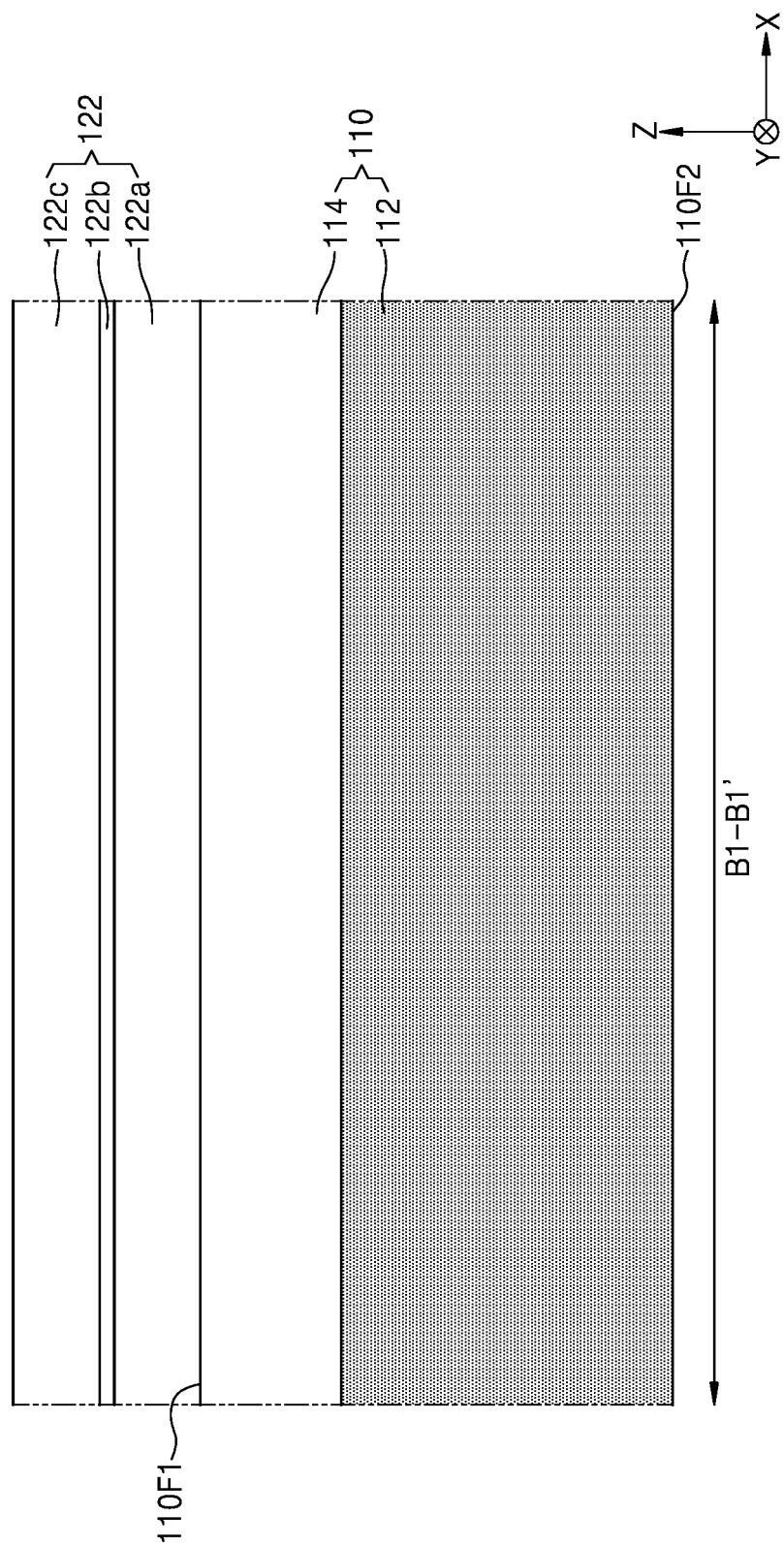
Figure 18C:
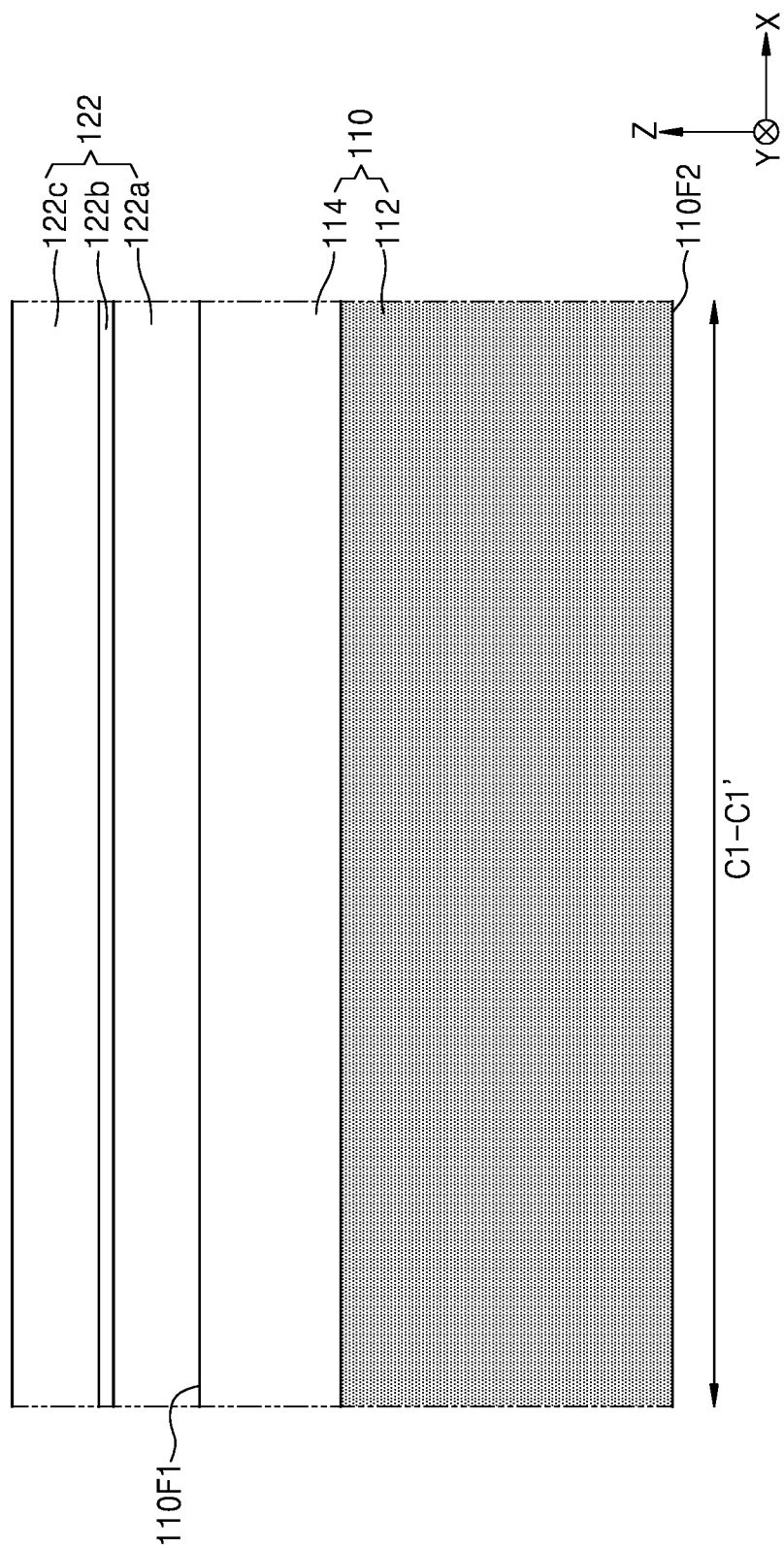

Referring to FIGS. 18A to 18C, an epitaxial growth process may be performed on a semiconductor substrate 112 to form an epitaxial semiconductor layer 114.

In example embodiments, the semiconductor substrate 112 may be a silicon (Si) substrate, and may be a substrate heavily doped with first impurities and having a silicon {111} crystal plane. However, the inventive concept is not limited thereto, and the semiconductor substrate 112 may include a silicon germanium (SiGe) substrate, a germanium (Ge) substrate, or a silicon carbide (SiC) substrate.

In example embodiments, second impurities may be in situ doped in the epitaxial semiconductor layer 114 in the epitaxial growth process. In other embodiments, after the epitaxial semiconductor layer 114 is formed, the second impurities may be implanted into the epitaxial semiconductor layer 114.

Hereinafter, the semiconductor substrate 112 and the epitaxial semiconductor layer 114 are collectively referred to as a substrate 110. The surface of the epitaxial semiconductor layer 114 is exposed to a first surface 110F1 of the substrate 110.

Next, a light-emitting stack 122 may be formed on the first surface 110F1 of the substrate 110.

The light-emitting stack 122 may include a first conductive type semiconductor layer 122a, an active layer 122b, and a second conductive type semiconductor layer 122c, sequentially formed on the first surface 110F1 of the substrate 110.

Figure 19A:
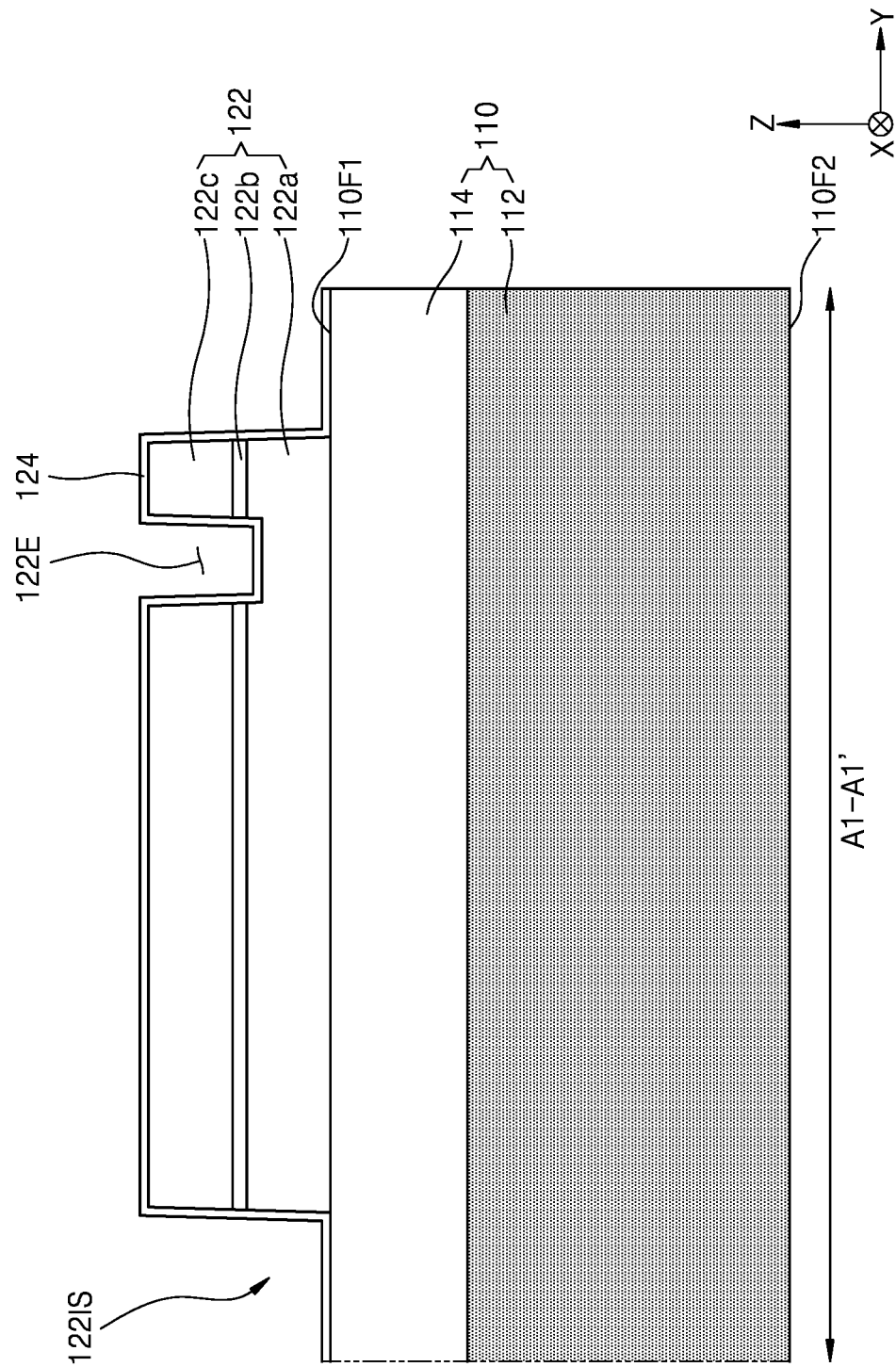
Figure 19B:
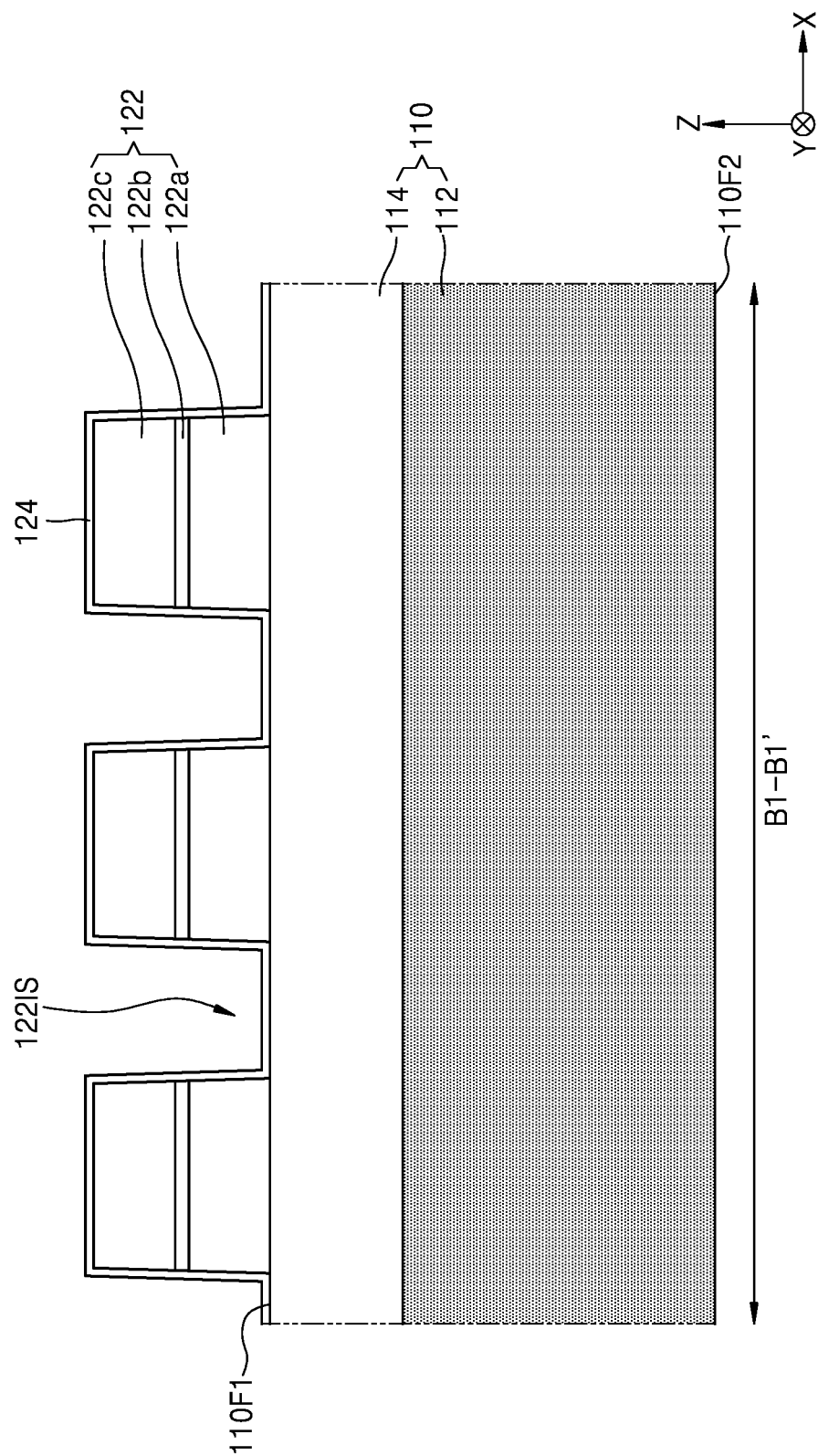
Figure 19C:
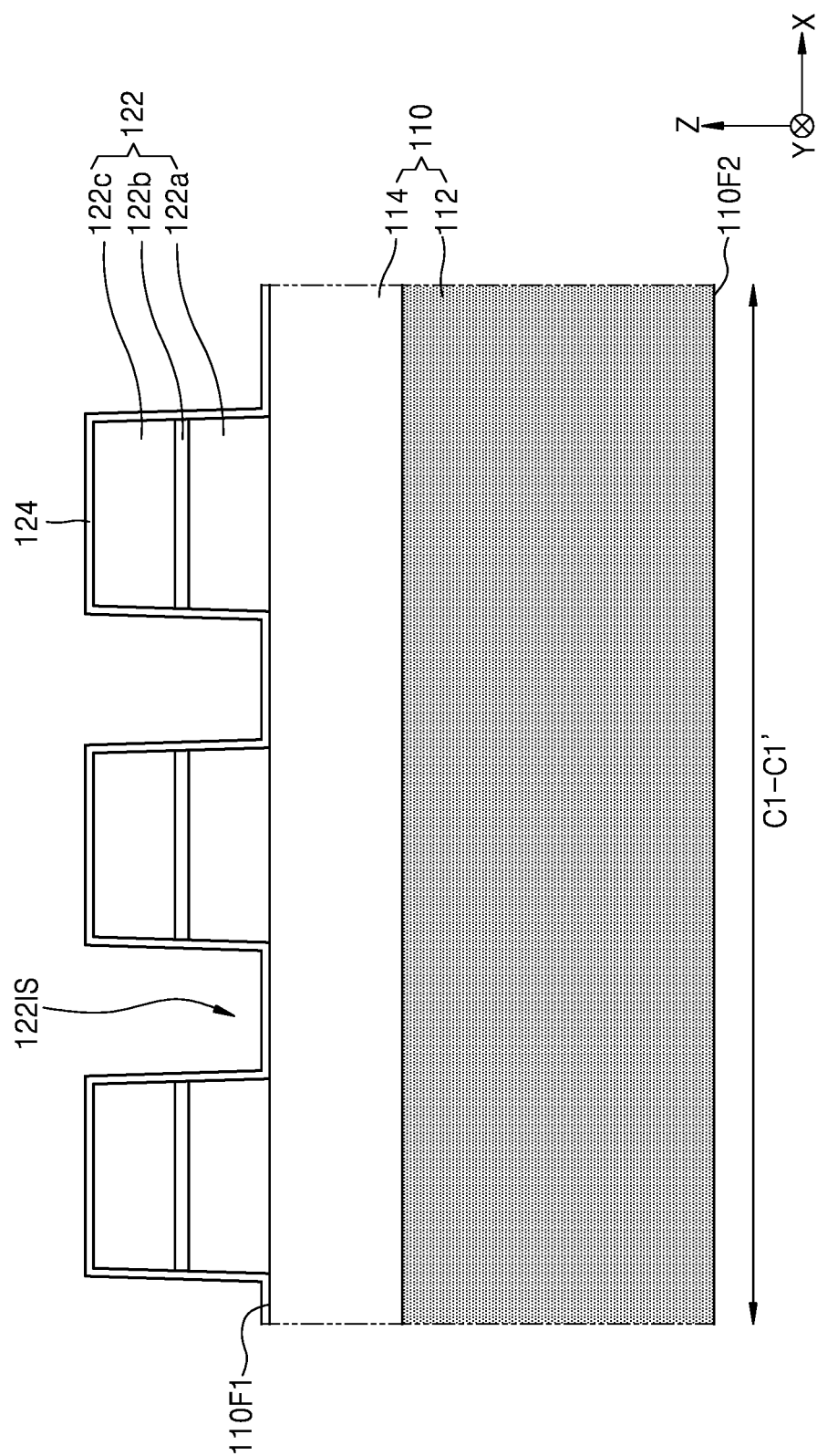

Referring to FIGS. 19A to 19C, a mask pattern (not shown) may be formed on the light-emitting stack 122 and a portion of the light-emitting stack 122 may be removed using the mask pattern as an etch mask to form a mesa etching portion 122E. The mesa etching portion 122E may expose the upper surface of the first conductive type semiconductor layer 122a.

Although not shown, an ohmic electrode (not shown) may be formed, by using a conductive ohmic material, on the upper surface of the first conductive type semiconductor layer 122a exposed by the mesa etching portion 122E and/or on the upper surface of the second conductive type semiconductor layer 122c.

Thereafter, an isolation process for separating the light-emitting stack 122 into a plurality of light emitting regions may be performed. For example, a portion of the light-emitting stack 122 may be removed by an etching process or a blade process until the first surface 110F1 of the substrate 110 is exposed to form an isolation region 122IS. Accordingly, the light-emitting stack 122 may be separated into a plurality of light emitting regions that are spaced apart from one another by the isolation region 122IS.

In the isolation process, a portion of the substrate 110 around the light-emitting stack 122 may be over-etched, and a recessed region 114R may be formed in the substrate 110 around the light-emitting stack 122. In this case, the light-emitting device package 100A described with reference to FIGS. 11 and 12 may be formed.

Next, an insulating layer 124 may be formed to cover the light-emitting stack 122 and the first surface 110F1 of the substrate 110 exposed by the isolation region 122IS.

Figure 20A:
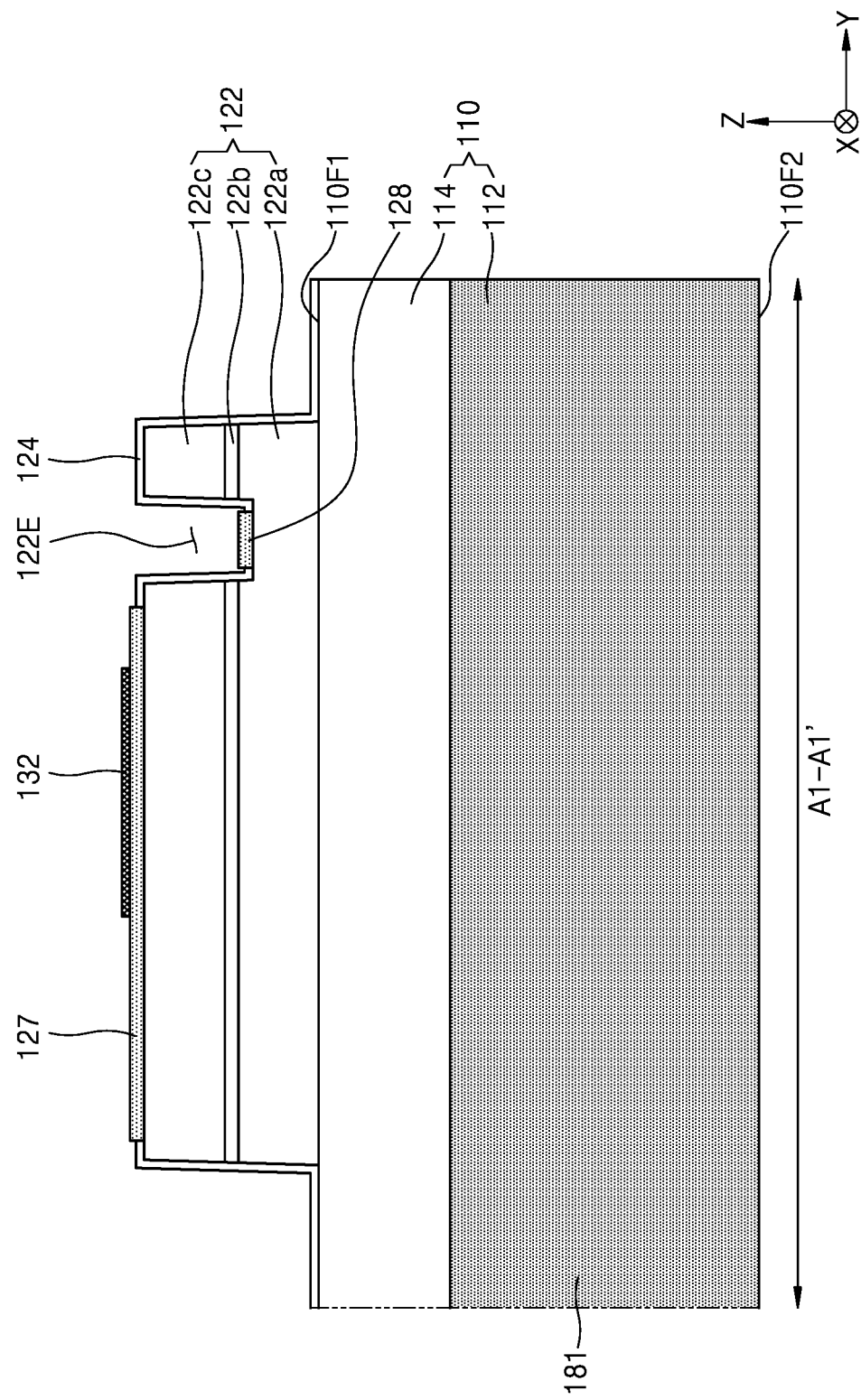
Figure 20B:
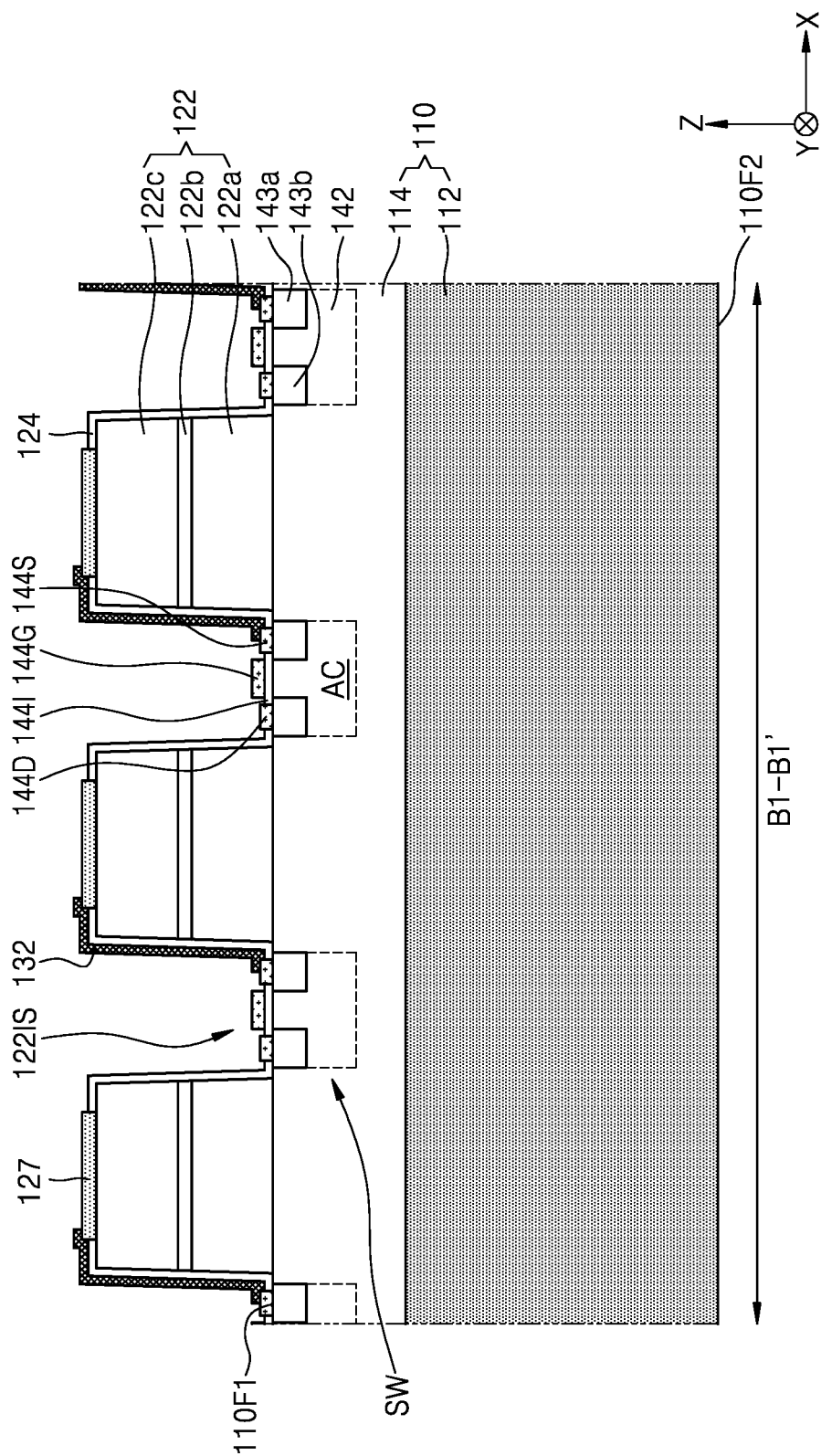
Figure 20C:
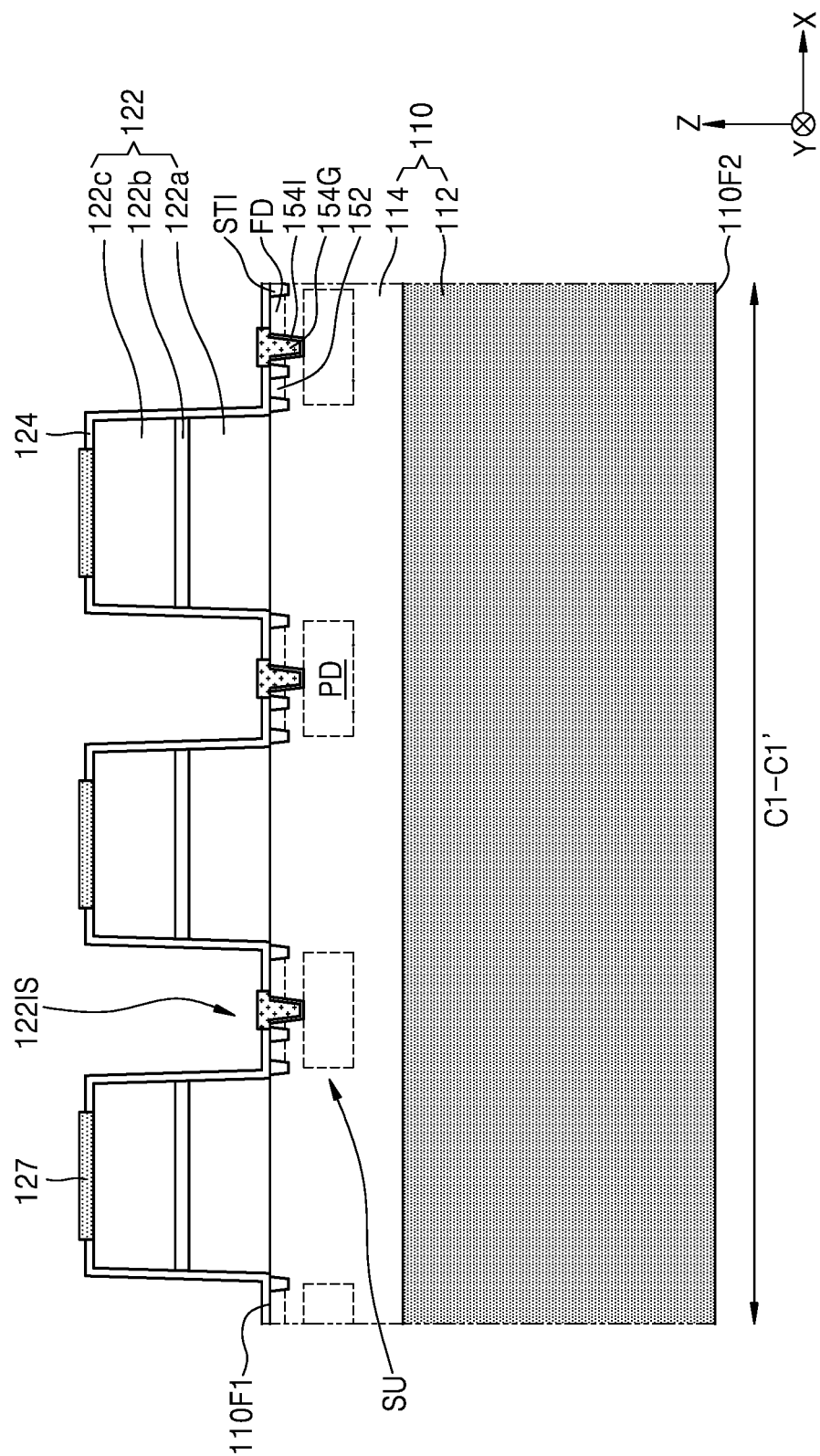

Referring to FIGS. 20A to 20C, an active region AC of a switch SW may be formed, in a portion of the substrate 110 exposed by the isolation region 122IS, by performing an ion implantation process on the first surface 110F1 of the substrate 110.

In example embodiments, to form the active region AC, a first mask pattern (not shown) may be formed on the insulating layer 124 and a p-well 142 may be formed by implanting impurity ions into the substrate 110 at the isolation region 122IS by using the first mask pattern as an ion implantation mask. Then, the first mask pattern may be removed. Next, a second mask pattern (not shown) may be formed on the insulating layer 124, and source and drain regions 143a and 143b may be formed by implanting impurity ions into the substrate 110 at the isolation region 122IS by using the second mask pattern as an ion implantation mask. Then, the second mask pattern may be removed.

A device region of a sensor SU may be formed, in another portion of the substrate 110 exposed by the isolation region 122IS, by performing an ion implantation process on the first surface 110F1 of the substrate 110.

In exemplary embodiments, to form the device region, a third mask pattern (not shown) may be formed on the insulating layer 124, and a photoelectric conversion region PD and a well region PW may be formed by implanting impurity ions into the substrate 110 at the isolation region 122IS by using the third mask pattern as an ion implantation mask. For example, the photoelectric conversion region PD may be doped with n-type impurities, and the well region PW may be doped with p-type impurities. At least one of the photoelectric conversion region PD and the well region PW may have a structure including a plurality of impurity regions doped with impurities at different concentrations.

The photoelectric conversion region PD and the well region PW may be formed inside the epitaxial semiconductor layer 114. As the epitaxial semiconductor layer 114 has a p-type impurity concentration smaller than that of the semiconductor substrate 112, the epitaxial semiconductor layer 114 may be more suitable for a device region for forming the photoelectric conversion region PD and the well region PW.

A fourth mask pattern (not shown) may be formed on the first surface 110F1 of the substrate 110, and a device isolation trench (not shown) may be formed by etching the substrate 100 by using the fourth mask pattern as an etch mask. Then, a device isolation layer STI may be formed on the first surface 110F1 of the substrate 110 to fill the device isolation trench with an insulating material.

A transfer transistor gate 154G may be formed on the first surface 110F1 of the substrate 110, and a floating diffusion region FD and an impurity region 152 may be formed by an ion implantation process.

Thereafter, a portion of the insulating layer 124 positioned on the light-emitting stack 122 may be removed, and the first electrode 127 and the second electrode 128 may be formed on the first conductive type semiconductor layer 122a and the second conductive type semiconductor layer 122c, respectively, by using a conductive material. A portion of the insulating layer 124 positioned on the active region AC may be removed and a source electrode 144S and a drain electrode 144D may be formed on the source and drain regions 143a and 143b by using a conductive material. In example embodiments, the first electrode 127, the second electrode 128, the source electrode 144S, and the drain electrode 144D may be formed using the same process and/or using the same material. A connection electrode 132 for electrically connecting the first electrode 127 to the source electrode 144S may be formed.

Thereafter, a gate insulating layer 144I and a gate electrode 144G may be formed on the active region AC. In example embodiments, the gate insulating layer 144I may be a portion of the insulating layer 124 which remains on the active region AC. Alternatively, the gate insulating layer 144I may be formed on the active region AC by using an insulating material after the insulating layer 124 is removed.

Although an example process for forming a portion of the switch SW and a portion of the sensor SU in the substrate 110 and/or on the substrate 110 has been described herein, the inventive concept is not limited to the above-described manufacturing method. The process sequence, the manufacturing method, or the shape of the switch SW and the sensor SU may be variously changed as is already known.

Figure 21B:
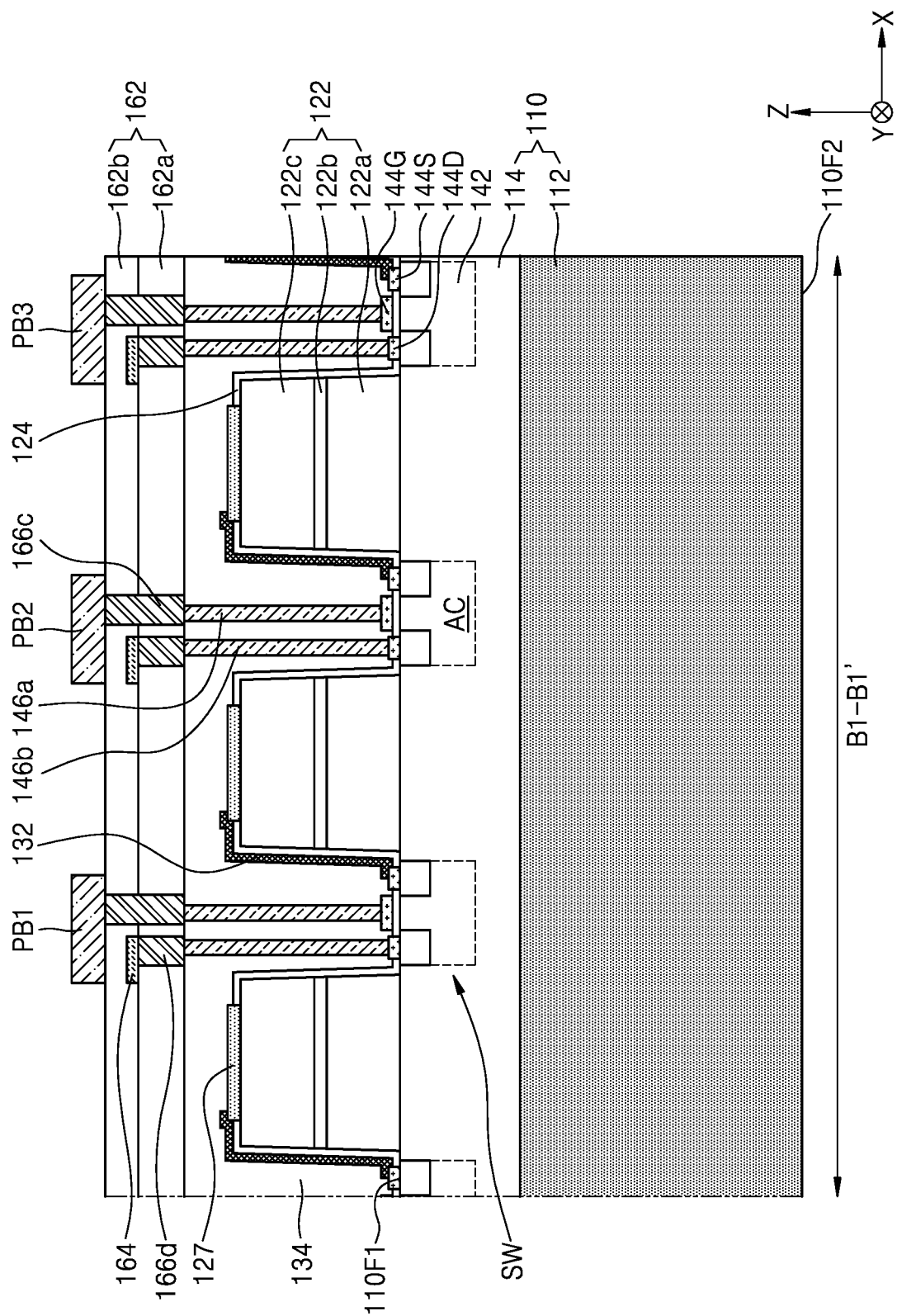

Referring to FIGS. 21A to 21C, an insulating material may be deposited on the light-emitting stack 122 and the insulation layer 124 while filling the isolation region 122IS, and an upper portion of the insulating material may be planarized to form a molding member 134. The molding member 134 may cover the switch SW and the sensor SU in the isolation region 122IS.

Thereafter, a connection via 136 passing through the molding member 134 may be formed.

In this case, connection vias 146a and 146b electrically connected to the gate electrode 144G and the drain electrode 144D may be formed in the switch SW, and connection vias 156a and 156b connected to the transfer transistor gate 154G and the impurity region 152 may be formed in the sensor SU.

Thereafter, a multilayered insulating structure 162 may be prepared. The multilayer insulating structure 162 may be separately formed in the same manner as a printed circuit board and attached to the molding member 134. Alternatively, the multilayered insulating structure 162 may be formed by sequentially forming an insulating layer and a metal layer on the molding member 134.

Figure 22A:
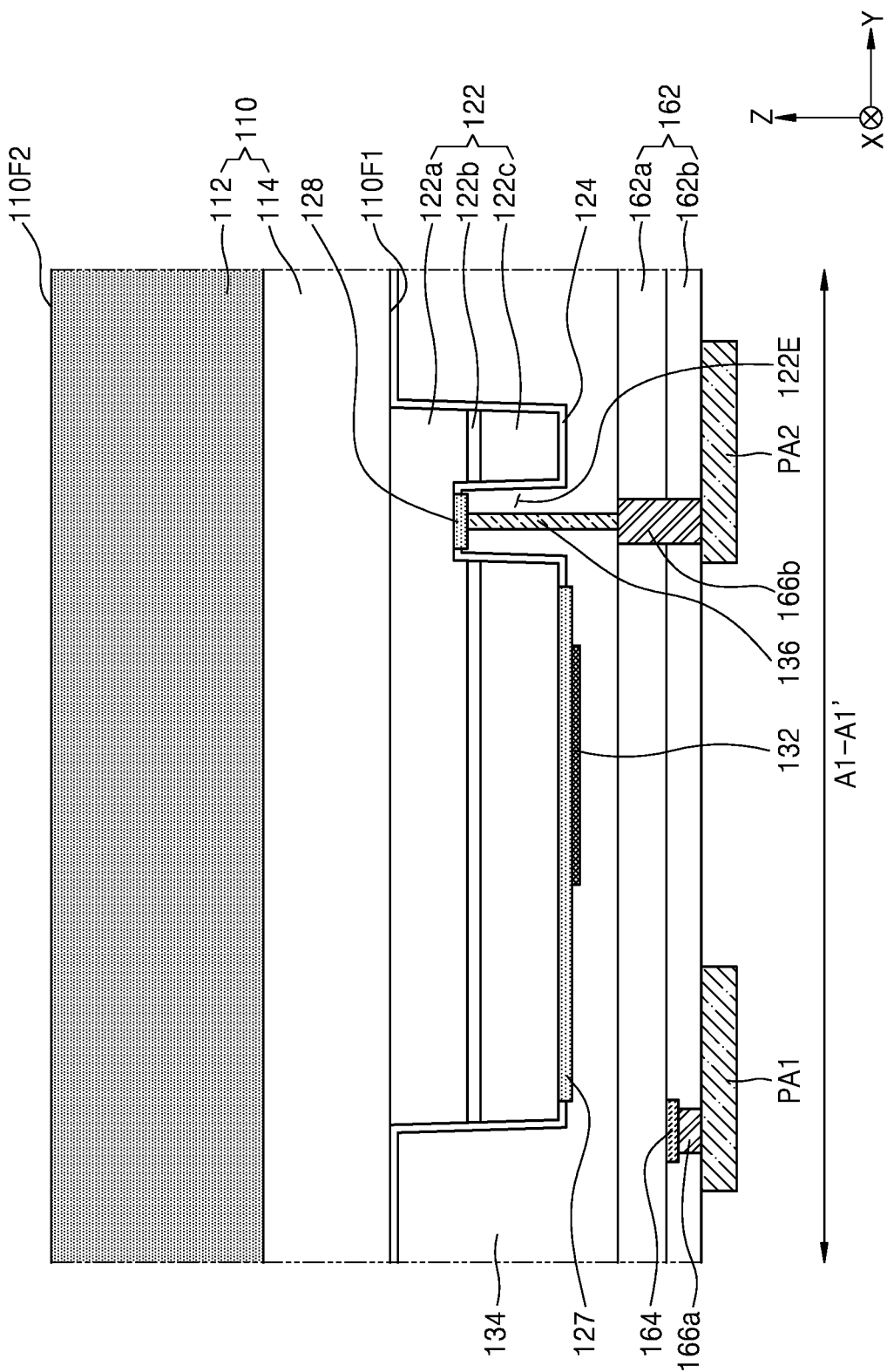
Figure 22B:
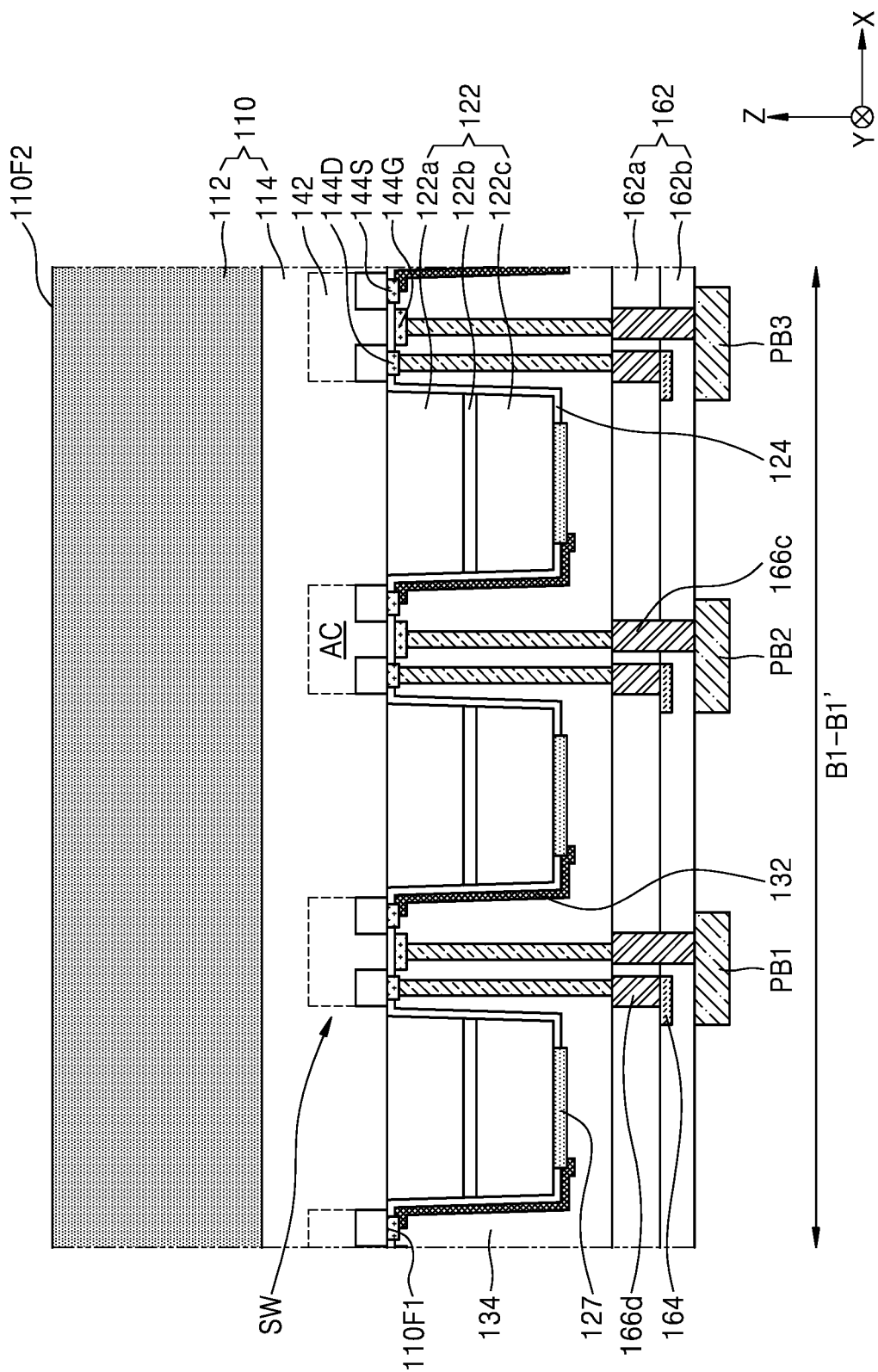
Figure 22C:
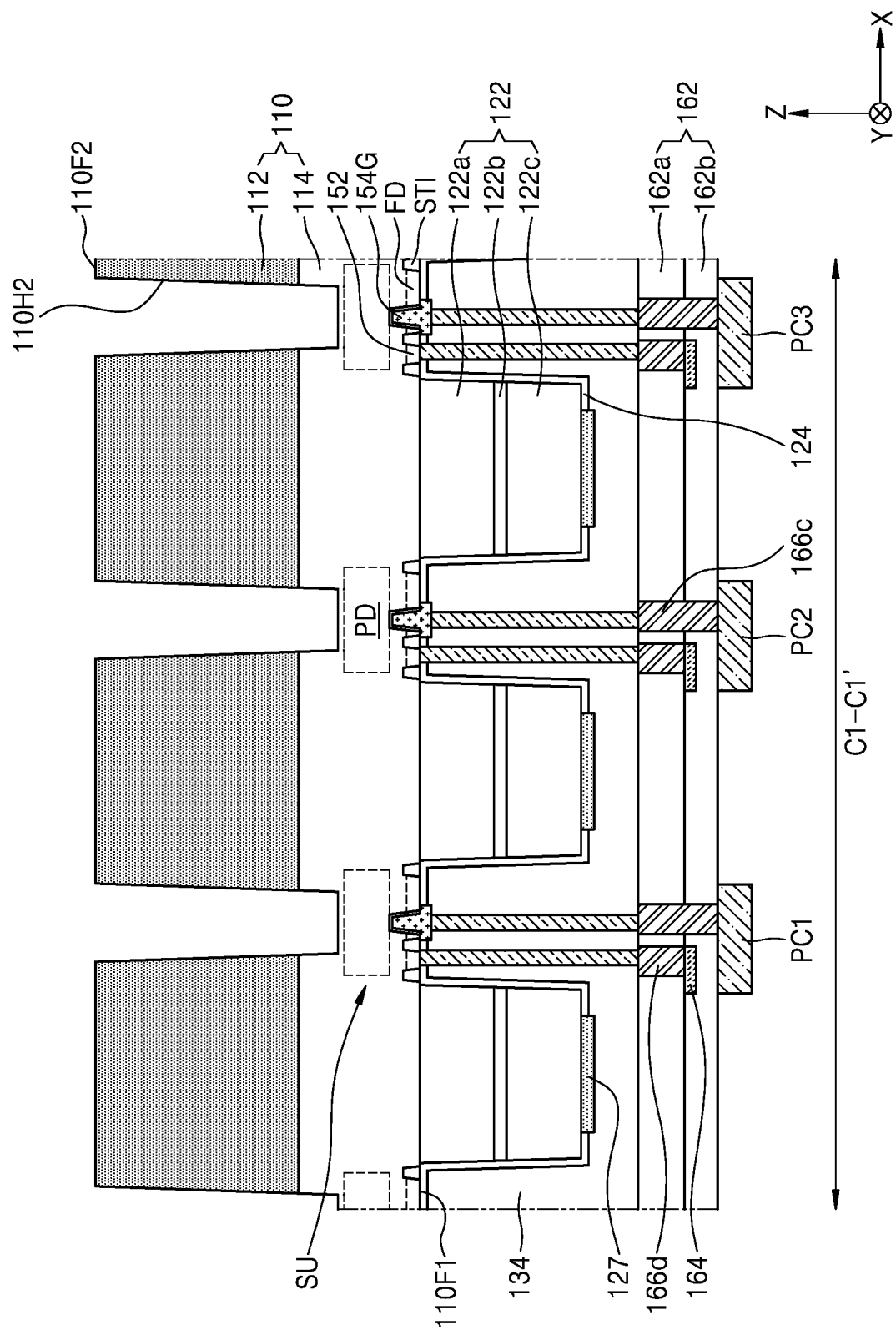

Referring to FIGS. 22A to 22C, the light-emitting stack 122 attached to the substrate 110 may be reversed such that a second surface 110F2 opposite to the first surface 110F1 of the substrate 110 faces upwards. Then, the level of the second surface 110F2 of the substrate 110 may be lowered by removing an upper portion of the substrate 110 from the second surface 110F2 of the substrate 110 by using a grinding process. In this case, a support substrate (not shown) may be attached on the second surface 110F2 of the substrate 110.

Thereafter, a mask pattern (not shown) may be formed on the second surface 110F2 of the substrate 110 and a second opening 110H2 may be formed in the substrate 110 by using the mask pattern as an etch mask. The second opening 110H2 may be formed at a position overlapping the sensor SU. The second opening 110H2 may pass through the semiconductor substrate 112 and extend to the inside of the epitaxial semiconductor layer 114, and thus, the upper surface of the epitaxial semiconductor layer 114 may be exposed by the bottom of the second opening 110H2.

Figure 23A:
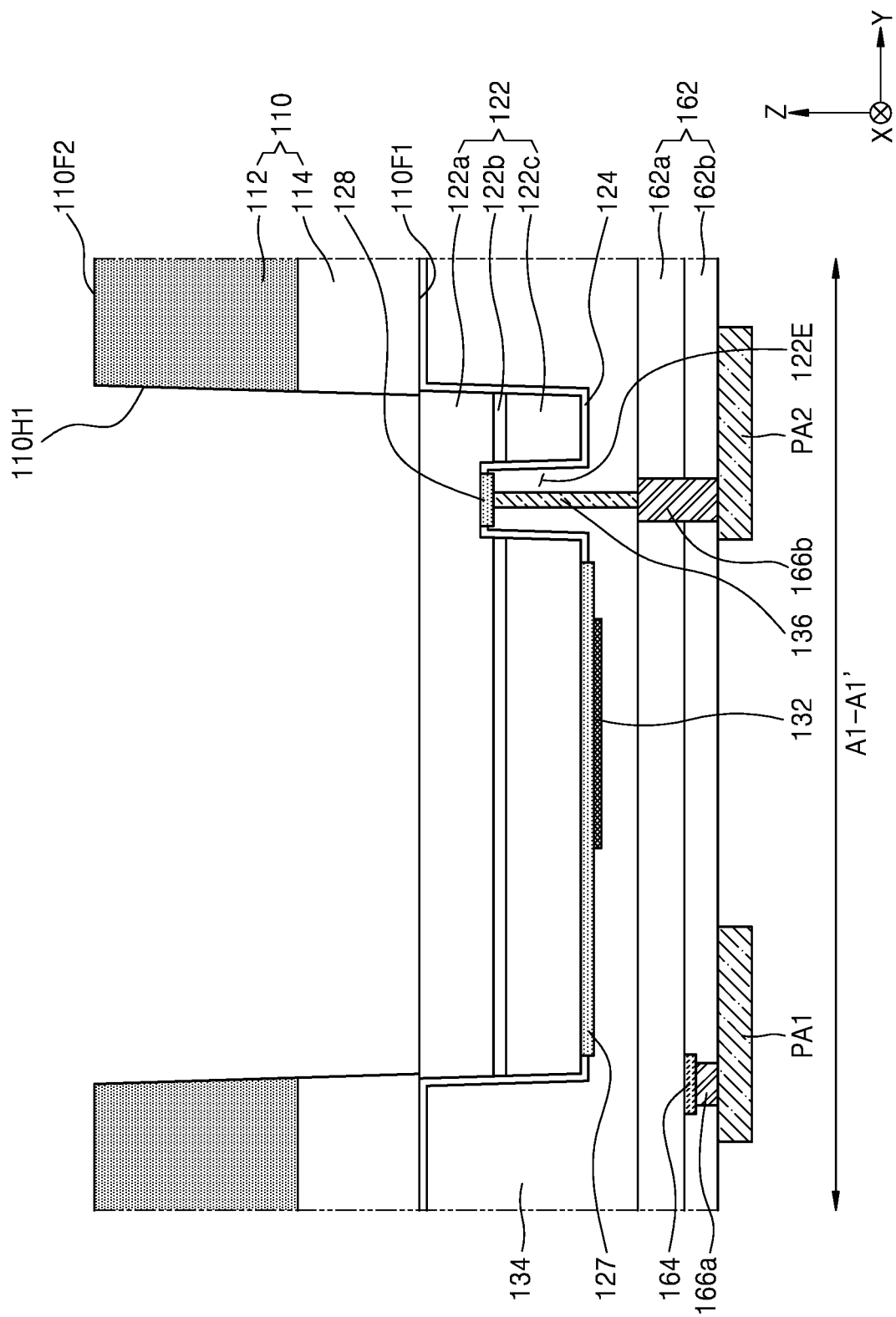
Figure 23B:
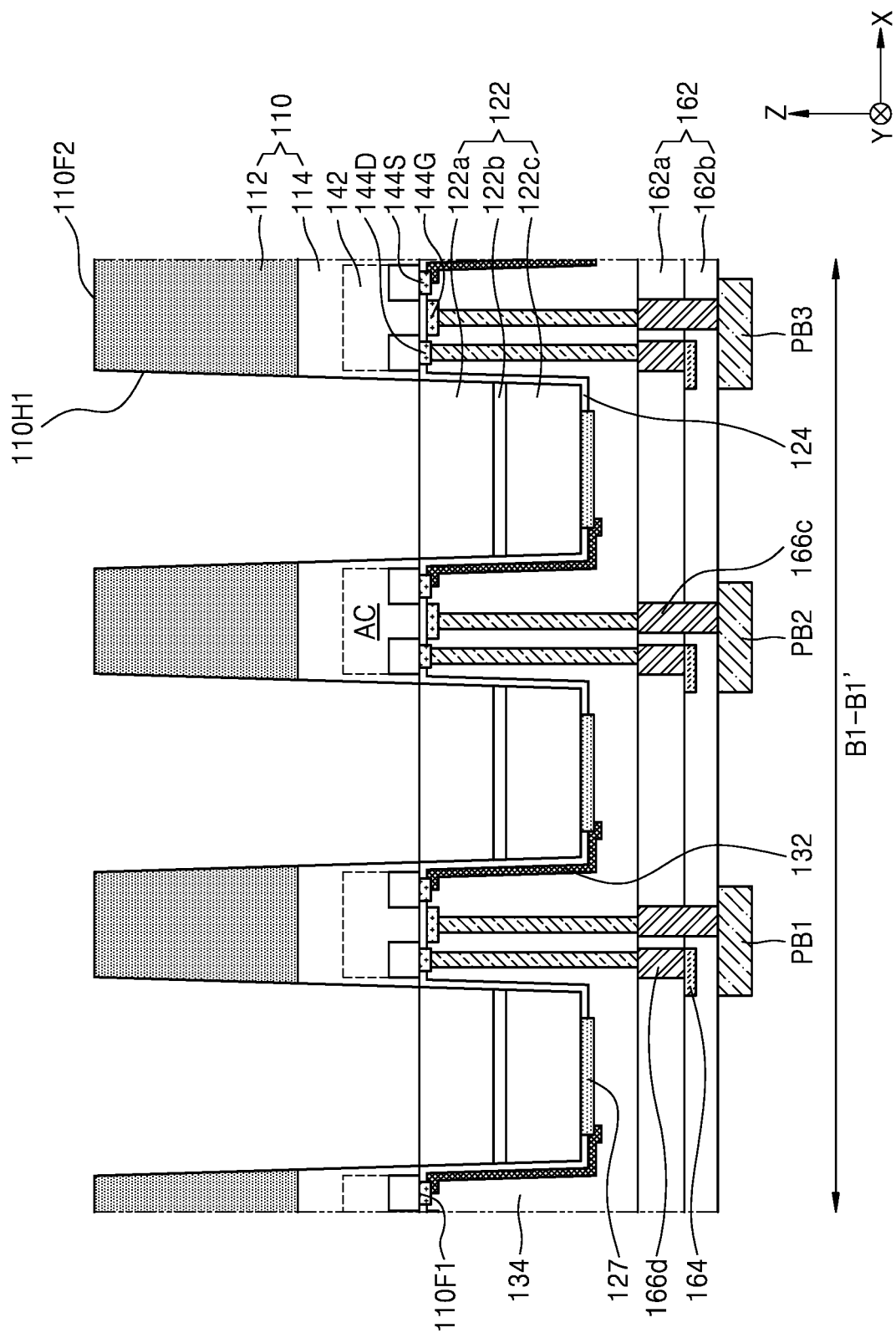
Figure 23C:
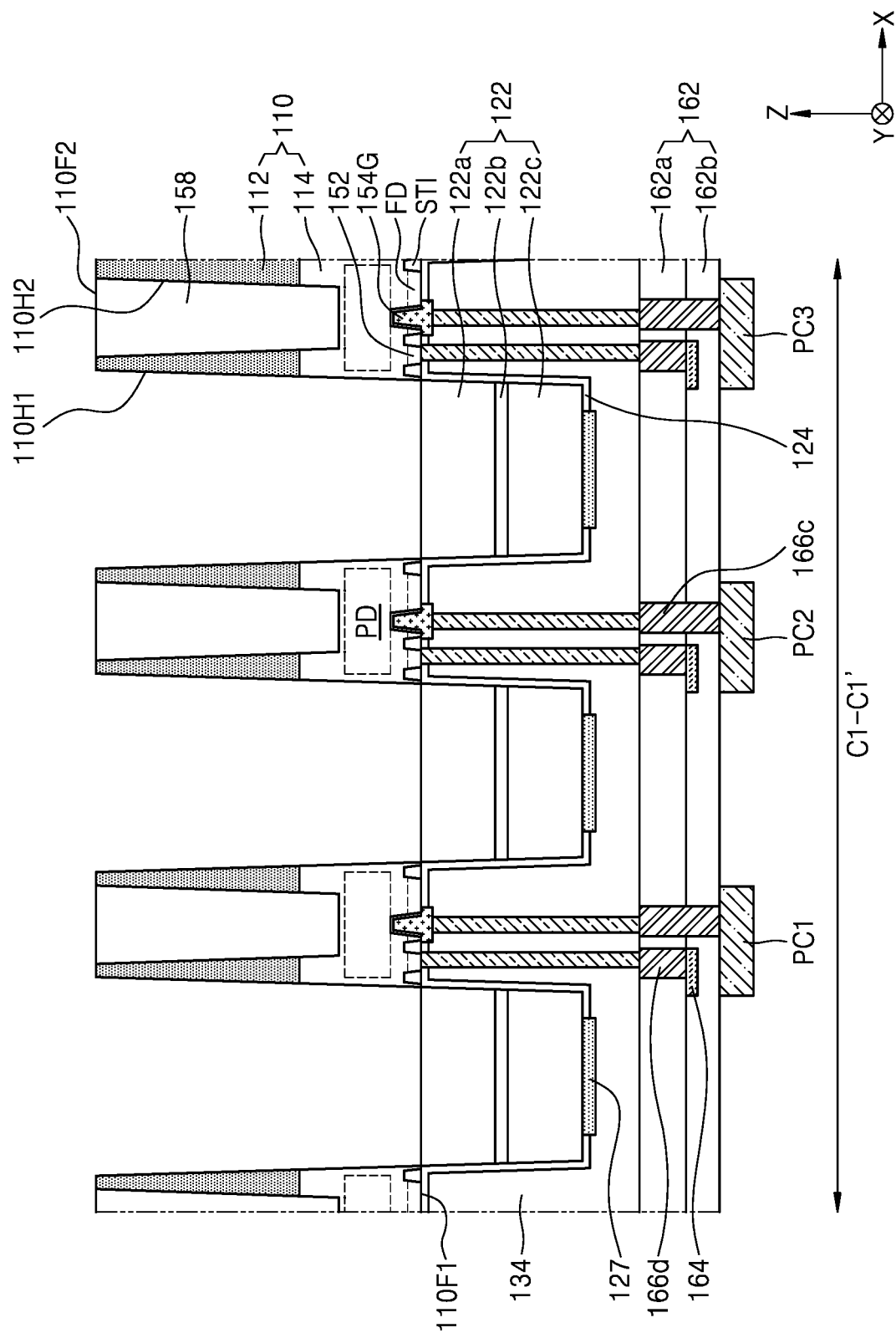

Referring to FIGS. 23A to 23C, a light guide insulating layer 158 may be formed to fill the inside of the second opening 110H2. The light guide insulating layer 158 may be formed using an insulating material.

Thereafter, a mask pattern (not shown) may be formed on the second surface 110F2 of the substrate 110 and the first opening 110H1 may be formed in the substrate 110 by using the mask pattern as an etch mask. The first opening 110H1 may be formed at a position overlapping the light-emitting stack 122. The first opening 110H1 may pass through both the semiconductor substrate 112 and the epitaxial semiconductor layer 114 and the upper surface of the light-emitting stack 122 may be exposed by the first opening 110H1.

In the process described with reference to FIGS. 23A to 23C, the first conductive type semiconductor layer 122a exposed at the bottom of the first opening 110H1 may be etched to form a concave-convex structure (not shown). In this case, the light extraction efficiency of the light-emitting device package 100 may be further improved.

Also, before the light guide insulating layer 158 is formed, a conductive layer (not shown) may be formed on the second surface 110F2 of the substrate 110 and the inner wall of the second opening 110H2, and an anisotropic etching process may be performed on the conductive layer to thereby form a reflective layer 159 on the sidewall of the second opening 110H2. Thereafter, a conductive layer (not shown) may be formed on the second surface 110F2 of the substrate 110 and the inner wall of the first opening 110H1, and an anisotropic etching process may be performed on the conductive layer to thereby form a reflective layer 187 on the sidewall of the first opening 110H1. In this case, the light-emitting device package 100C described with reference to FIG. 14 may be formed.

Figure 24A:
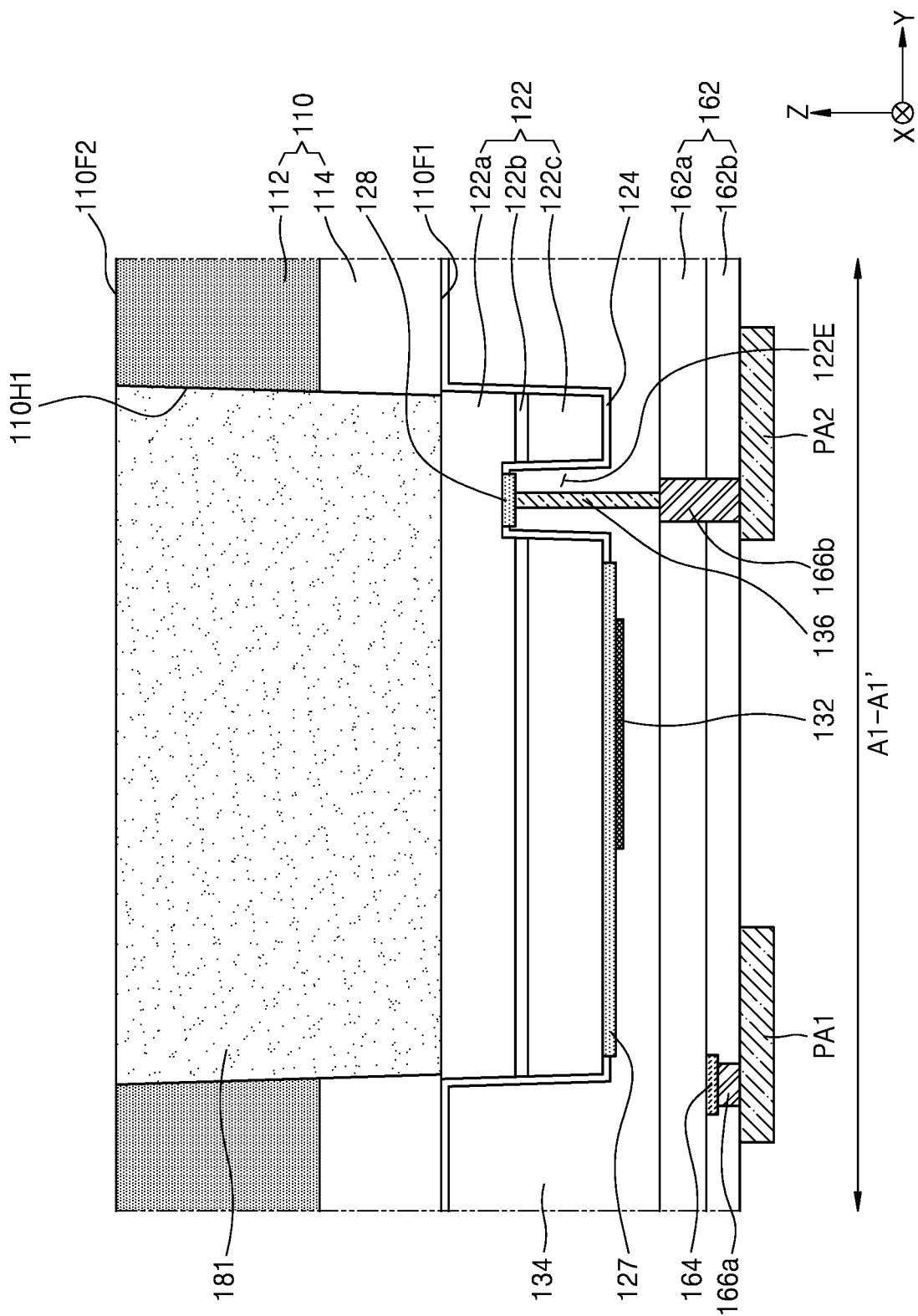
Figure 24B:
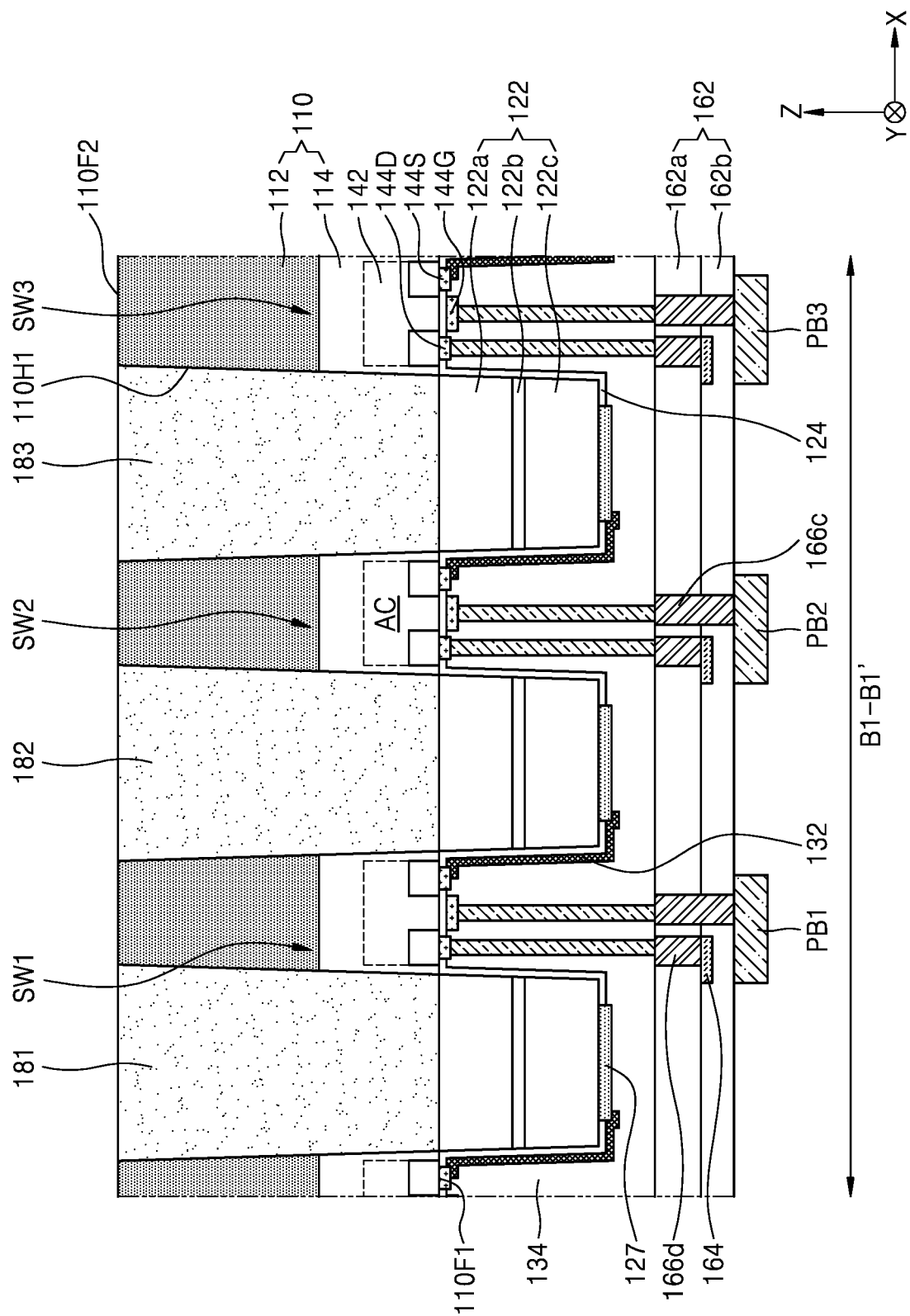

Referring to FIGS. 24A to 24C, wavelength conversion layers 181, 182, and 183 filling the inside of the first opening 110H1 may be formed.

In example embodiments, the wavelength conversion layers 181, 182, and 183 may be formed by applying or dispensing a resin, in which phosphor particles are dispersed, into the first opening 110H1. The wavelength conversion layers 181, 182, and 183 may include two or more kinds of phosphor particles having different size distributions so that the phosphor particles may be uniformly dispersed in the first opening 110H1.

Thereafter, referring back to FIGS. 5 to 7, an encapsulation layer 186 may be formed on the second surface 110F2 of the substrate 110, the wavelength conversion layers 181, 182, and 183, and the light guide insulating layer 158.

In example embodiments, after the encapsulation layer 186 is formed, the substrate 110 may be singulated into individual light-emitting device packages 100 via a dicing process. The light-emitting device packages 100 may be singulated into units of one pixel including first to third light-emitting structures LS1, LS2, and LS3, respectively. Alternatively, the light-emitting device packages 100 may be singulated into various sizes to include a plurality of pixels arranged in a matrix.

While the inventive concept has been particularly shown and described with reference to embodiments thereof, it will be understood that various changes in form and details may be made therein without departing from the spirit and scope of the following claims.

What is claimed is:

1. A light-emitting device package comprising:
    a substrate having a first surface, a second surface, a first opening that extends through the substrate from the first surface to the second surface, and a second opening spaced apart from the first opening;
    a light-emitting structure disposed on the first surface of the substrate and vertically overlapping the first opening; and
    an image sensor comprising a photoelectric conversion region, the photoelectric conversion region being disposed in the substrate and vertically overlapping the second opening,
    wherein light from the light-emitting structure is emitted toward the second surface of the substrate through the first opening, and
    wherein the first surface of the substrate is interposed between the light-emitting structure and the photoelectric conversion region along a direction perpendicular to the first surface of the substrate.

2. The light-emitting device package of claim 1, wherein the image sensor is configured to sense light reflected by an object on the substrate, based on light emitted from the light-emitting structure.

3. The light-emitting device package of claim 1, wherein the substrate comprises a light guide portion defined by an inner wall of the second opening, and
    wherein the light guide portion provides a light path through which light incident into the second opening reaches the photoelectric conversion region.

4. The light-emitting device package of claim 1, further comprising:
    a wavelength conversion layer filling the first opening; and
    a light guide insulating layer filling the second opening and having an upper surface coplanar with an upper surface of the wavelength conversion layer.

5. The light-emitting device package of claim 1, further comprising:
    a switch disposed in the substrate and electrically connected to the light-emitting structure, the switch being configured to drive the light-emitting structure.

6. A display device comprising a display area and a fingerprint-sensing area overlapping at least a portion of the display area,
    wherein the fingerprint-sensing area comprises the light-emitting device package of claim 1, and
    wherein the image sensor is configured to sense light reflected by an object on the substrate, based on light emitted from the light-emitting structure.

7. The display device of claim 6, wherein the fingerprint-sensing area comprises a plurality of pixels,
    wherein each of the pixels comprises a first subpixel, a second subpixel, and a third subpixel, and
    wherein a first light-emitting structure in the first subpixel, a second light-emitting structure in the second subpixel, and a third light-emitting structure in the third subpixel are spaced apart from each other, and at least one of the first to third subpixels comprises the image sensor.

8. The display device of claim 6, wherein the fingerprint-sensing area comprises a plurality of pixels,
    wherein each of the pixels comprises a red subpixel, a blue subpixel, and a green subpixel,
    wherein the red, blue and green subpixels comprise a first image sensor, a second image sensor, and a third image sensor, respectively,
    wherein the first image sensor and a first light-emitting structure are horizontally arranged in a first subpixel, and
    wherein the first surface of the substrate is interposed between a first light-emitting structure of the red subpixel and a first photoelectric conversion region of the first image sensor, between a second light-emitting structure of the blue subpixel and a second photoelectric conversion region of the second image sensor, and between a third light-emitting structure of the green subpixel and a third photoelectric conversion region of the third image sensor.

9. A display device comprising a plurality of pixels,
    wherein at least one of the plurality of pixels comprises the light-emitting device package of claim 1, and wherein the image sensor is configured to sense light reflected by an object on the substrate based on light emitted from the light-emitting structure.

10. The display device of claim 9, wherein the object comprises a user's finger, and
wherein the image sensor is further configured to sense the reflected light and output an image signal for a fingerprint.

11. The display device of claim 9, further comprising:
a switch disposed in the substrate and electrically connected to the light-emitting structure, the switch being configured to drive the light-emitting structure.

12. A display device comprising a plurality of pixels each of which comprises a plurality of subpixels,
wherein the plurality of subpixels comprise and share a light-emitting structure configured to generate and emit light,
wherein the light-emitting structure is formed on a first surface of a substrate and comprises as many number of regions as the plurality of subpixels,
wherein at least one image sensor is provided on a second surface, opposite to the first surface, of the substrate where the light-emitting structure is divided to form the regions of the light emitting structure, and is configured to sense light reflected by an object on an encapsulation layer, based on the light emitted from the light-emitting structure,
wherein the second surface is interposed between the encapsulation layer and the first surface,
wherein a number of the at least one image sensor is the same as a number of the regions of the light emitting structure,
wherein a plurality of openings are formed through the substrate, and
wherein one of the plurality of openings extends through the substrate from the first surface to the second surface, and exposes one of the plurality of subpixels.

13. The display device of claim 12, wherein at least one switch is provided at a side of the at least one image sensor, respectively, on the second surface of the substrate where the light-emitting structure is divided to form the regions of the light emitting structure, and
wherein the at least one switch is configured to drive the light-emitting structure.

14. The display device of claim 12, wherein the plurality of openings are filled with a light guide layer through which the light emitted from the light-emitting structure and incident into the plurality of openings are directed to the second surface of the substrate.

15. The display device of claim 14, wherein the at least one image sensor comprises a photoelectric conversion region vertically overlapping at least one of the plurality of openings.

16. The display device of claim 12, wherein the plurality of subpixels comprises a red subpixel, a green subpixel and a blue subpixel, and
wherein regions of the light-emitting structure comprise a first light-emitting structure that corresponds to the red subpixel, a green light-emitting structure corresponding to the green subpixel and a blue light-emitting structure corresponding to the blue subpixel.

* * * * *